US008101472B2

(12) United States Patent
Sato et al.

(10) Patent No.: US 8,101,472 B2
(45) Date of Patent: Jan. 24, 2012

(54) METHOD FOR MANUFACTURING TFT SUBSTRATE

(75) Inventors: Takeshi Sato, Kokubunji (JP); Yoshiaki Toyota, Hachioji (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 594 days.

(21) Appl. No.: 12/251,486

(22) Filed: Oct. 15, 2008

(65) Prior Publication Data

US 2009/0104737 A1 Apr. 23, 2009

(30) Foreign Application Priority Data

Oct. 19, 2007 (JP) ................................. 2007-272088

(51) Int. Cl.
*H01L 21/00* (2006.01)
(52) U.S. Cl. ........ 438/163; 438/149; 438/151; 438/153; 438/154; 438/164; 257/E51.005; 257/E29.151
(58) Field of Classification Search .................. 438/149, 438/151, 153, 154, 163, 164; 257/E51.005, 257/E29.151
See application file for complete search history.

(56) References Cited

U.S. PATENT DOCUMENTS

| 7,524,593 | B2 | 4/2009 | Ohnuma |
| 2007/0037069 | A1 | 2/2007 | Ohnuma |
| 2008/0020519 | A1* | 1/2008 | Cheng ........................... 438/149 |

FOREIGN PATENT DOCUMENTS

| JP | 2002-217429 | 8/2002 |
| JP | 2007-072451 | 3/2007 |

OTHER PUBLICATIONS

Soo-Jeong Park et al., Realization of 6Mask LTPS CMOS Panel for AMLCD Application, SID Symposium Digest of Technical Papers, (May 2007) pp. 73-75, vol. 38, Issue 1, The Society for Information Display.

* cited by examiner

*Primary Examiner* — N Drew Richards
*Assistant Examiner* — Yu-Hsi D Sun
(74) *Attorney, Agent, or Firm* — Antonelli, Terry, Stout & Kraus, LLP.

(57) ABSTRACT

A method for manufacturing a TFT substrate in which a channel length can be stably formed while the number of masks is reduced. The method includes processing a gate of the n-type TFT, a gate of the p-type TFT, and an upper capacitor electrode by using a half-tone mask instead of some of normal masks to reduce the number of masks, and changing impurity concentrations of semiconductor films located in regions which become a channel of the n-type TFT, a source and a drain of the n-type TFT, a channel of the p-type TFT, a source and a drain of the p-type TFT, and an lower capacitor electrode, by using a pattern of the half-tone mask and a normal mask.

3 Claims, 19 Drawing Sheets

P-TYPE TFT    N-TYPE TFT    CAPACITOR

P-TYPE TFT   N-TYPE TFT   CAPACITOR

|  | PCH/NCH | PSD | NSD/LD | BD |
|---|---|---|---|---|
| MSK | UNEXPOSED | UNEXPOSED | EXPOSED | EXPOSED |
| HMK | HALF-EXPOSED | EXPOSED | HALF-EXPOSED | UNEXPOSED |

P-TYPE TFT    N-TYPE TFT    CAPACITOR

P-TYPE TFT　　N-TYPE TFT　　CAPACITOR

P-TYPE TFT　　N-TYPE TFT　　CAPACITOR

|  | PCH | NCH | PSD | NSD/LD | BD | WR |
|---|---|---|---|---|---|---|
| MSK | UNEXPOSED | UNEXPOSED | EXPOSED | EXPOSED | EXPOSED | UNEXPOSED |
| HMK | EXPOSED | HALF-EXPOSED | EXPOSED | HALF-EXPOSED | UNEXPOSED | UNEXPOSED |

P-TYPE TFT    N-TYPE TFT    CAPACITOR

P-TYPE TFT   N-TYPE TFT   CAPACITOR

P-TYPE TFT   N-TYPE TFT   CAPACITOR

|  | PCH | NCH | PSD | NSD | BD | LD |
|---|---|---|---|---|---|---|
| MSK | UNEXPOSED | UNEXPOSED | EXPOSED | EXPOSED | UNEXPOSED | EXPOSED |
| HMK | HALF-EXPOSED | UNEXPOSED | HALF-EXPOSED | UNEXPOSED | EXPOSED | EXPOSED |

P-TYPE TFT    N-TYPE TFT    CAPACITOR

P-TYPE TFT    N-TYPE TFT    CAPACITOR

|     | PCH       | NCH            | PSD       | NSD            | BD        | LD      |
|-----|-----------|----------------|-----------|----------------|-----------|---------|
| MSK | UNEXPOSED | UNEXPOSED      | EXPOSED   | EXPOSED        | UNEXPOSED | EXPOSED |
| HMK | UNEXPOSED | HALF-EXPOSED   | UNEXPOSED | HALF-EXPOSED   | EXPOSED   | EXPOSED |

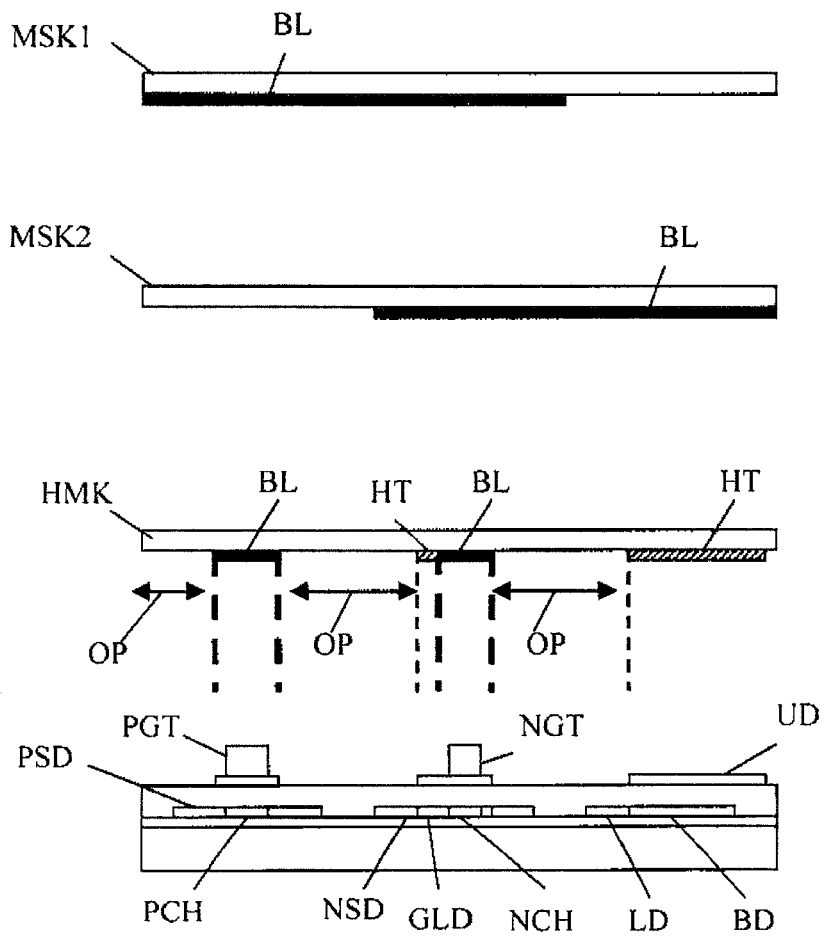
FIG.19 CONVENTIONAL
FIG.20 CONVENTIONAL
|      | PCH       | NCH       | PSD       | NSD/LD    | BD             |
|------|-----------|-----------|-----------|-----------|----------------|
| MSK1 | UNEXPOSED | UNEXPOSED | UNEXPOSED | UNEXPOSED | EXPOSED        |
| MSK2 | EXPOSED   | UNEXPOSED | EXPOSED   | UNEXPOSED | UNEXPOSED      |
| HMK  | UNEXPOSED | UNEXPOSED | EXPOSED   | EXPOSED   | HALF-EXPOSED   |

FIG.21A
CONVENTIONAL
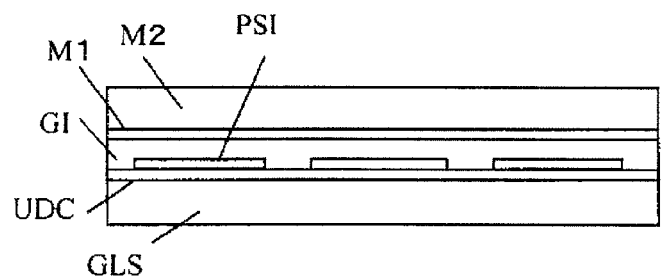
FIG.21B
CONVENTIONAL
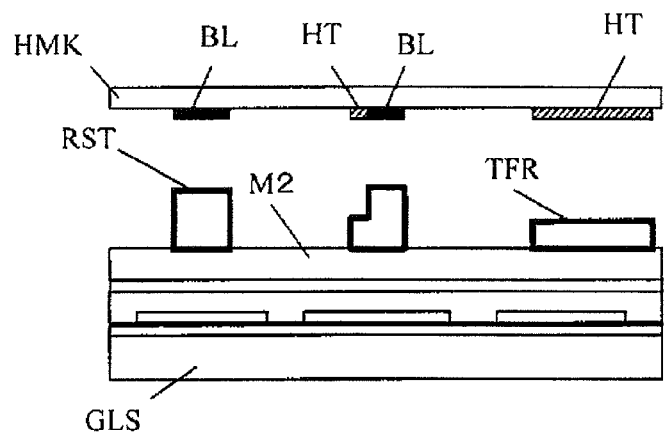
FIG.21C
CONVENTIONAL
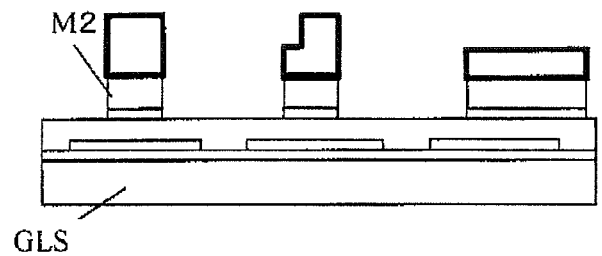
FIG.21D
CONVENTIONAL
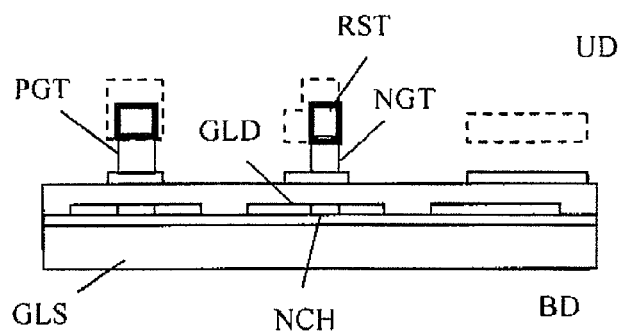

FIG.22A
CONVENTIONAL
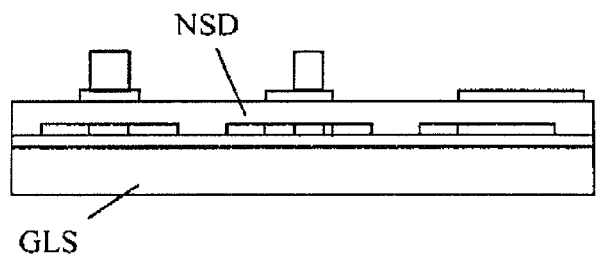
FIG.22B
CONVENTIONAL
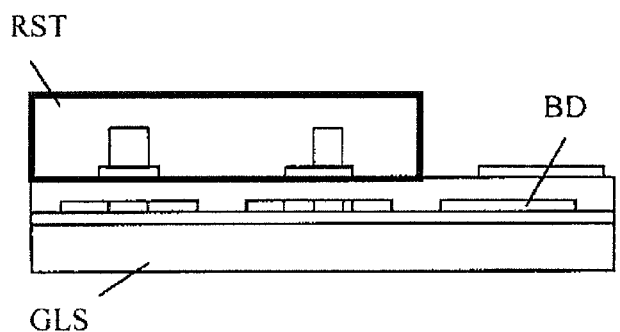
FIG.22C
CONVENTIONAL
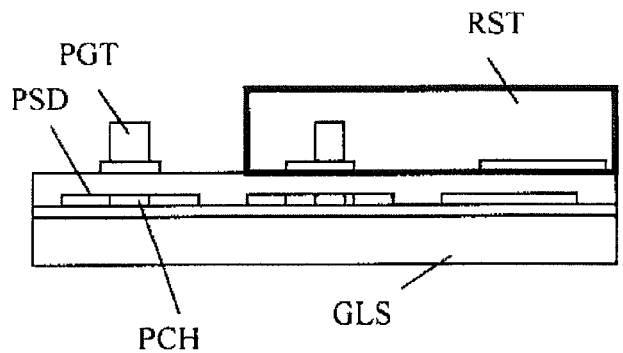
FIG.22D
CONVENTIONAL
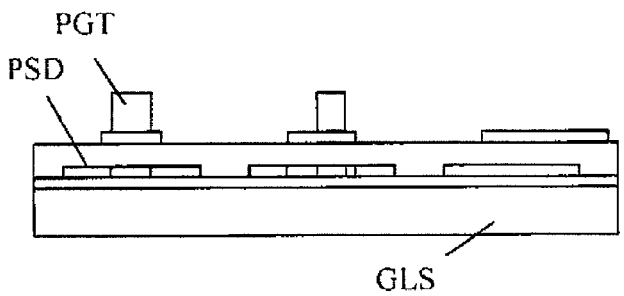

METHOD FOR MANUFACTURING TFT SUBSTRATE

CROSS-REFERENCE TO RELATED APPLICATION

The present application claims priority from Japanese application JP 2007-272088 filed on Oct. 19, 2007, the content of which is hereby incorporated by reference into this application.

BACKGROUND OF THE INVENTION

1. Field of the Invention

The present invention relates to a method for manufacturing a thin film transistor (TFT) substrate which is used in a liquid crystal display apparatus or a display apparatus using an organic electroluminescence device. More particularly, the present invention relates to a method for manufacturing a CMOS TFT substrate on which an n-type thin film transistor (TFT) and a p-type thin film transistor are included.

2. Description of the Related Art

A thin film transistor (hereinafter, referred to as TFT in some cases) is used in a liquid crystal display apparatus or the like. In a case where drive circuits are formed on a substrate in addition to pixels, there is generally used a TFT including a polycrystalline Si film, which is capable of providing high mobility. Particularly, a so-called CMOS TFT substrate on which both of n-type TFTs and p-type TFTs are formed has an advantage of flexibility in circuit design, compared with a TFT substrate on which only n-type TFTs are formed. However, there has conventionally been a problem that the number of masks used in manufacturing is increased.

In general, one more mask is required for formation of sources and drains of the p-type TFTs. In a case where threshold values are individually adjusted for the p-type TFTs and the n-type TFTs, another mask is required. As a method for reducing the number of masks, a contact process with pixel electrodes is eliminated. Further, a mask having semitransparent regions besides transparent regions and opaque regions, that is, a half-tone mask, is used to reduce the number of masks.

Examples of a method for unifying processing of a semiconductor film and processing of a metal film by using the half-tone mask, and a method for eliminating contacts with pixel electrodes are disclosed, for example, in SID 07 DIGEST, p. 73 (2007). An example of a method for unifying masks which are used for doping at a time of forming a gate and a source and drain is disclosed, for example, in JP 2002-217429 A and JP 2007-72451 A.

An example of a method for manufacturing a gate and doping for a semiconductor film of a CMOS TFT substrate according to a conventional technology, in which the half-tone mask is used, is shown in FIG. 19. FIG. 19 is a view showing mask patterns used in the manufacturing method and the structure of the TFT substrate obtained by using the mask patterns. Impurity implantation into an n-type TFT, a p-type TFT, and a capacitor, and electrode formation are performed by using three masks including two masks MSK1, MSK2 and a half-tone mask HMK. Note that FIG. 20 is a table showing correspondence relations between the mask patterns and respective regions of members formed on the TFT substrate. Each end of a channel PCH of the p-type TFT is defined by a boundary between an opaque region BL of the half-tone mask HMK and a transparent region OP thereof. Further, each end of a channel NCH of the n-type TFT is defined by a boundary between the opaque region BL of the half-tone mask HMK and a semitransparent region HT thereof, and a boundary between the opaque region BL of the half-tone mask HMK and the transparent region OP thereof, respectively.

Further, FIGS. 21A to 21D and 22A to 22D are process views showing an example of a method for manufacturing the TFT substrate shown in FIG. 19. In FIG. 21A, polysilicon PSI films are patterned on a glass substrate GLS via an undercoat film UDC, and a gate insulating film GI and metal films M1 and M2 are laminated thereon. Then, a thick-film resist pattern RST which corresponds to the opaque region BL and a thin-film resist pattern TFR which corresponds to the semitransparent region HT are formed by using the half-tone mask HMK. The metal films M2 and M1 are simultaneously etched to obtain a shape shown in FIG. 21C, and then the thin-film resist is removed by ashing. In this case, part of the thick-film resist is also removed and a dimension thereof is reduced. The metal film M2 is etched by using the remaining resist as a mask. After that, n-type impurities are implanted at low concentration via the metal film M1 and the gate insulating film GI, and gate overlapped drains GLD are formed, thereby obtaining the structure shown in FIG. 21D. After the resist is removed, the n-type impurities are implanted over the entire surface at high concentration and at low acceleration, and a source and drain NSD of the n-type TFT is formed by using the metal films M1 and M2 as masks. In addition, a different mask is used to form the resist pattern RST, and the n-type impurities are implanted to form a lower capacitor electrode BD, while protecting the TFTs, thereby obtaining the structure shown in FIG. 22B. After the resist is removed, as shown in FIG. 22C, a different mask is used to form the resist pattern RST for covering the n-type TFT and the capacitor, and p-type impurities are implanted at higher concentration than that of the n-type impurities to form a source and drain PSD of the p-type TFT. Then, the resist is removed, thereby obtaining the structure shown in FIG. 22D. With the three masks, the gates, the sources, and the drains of the n-type TFT and the p-type TFT, and the lower capacitor electrode are formed.

However, in the case where the processing of the semiconductor film and the processing of the metal film are unified by using the half-tone mask, the above-mentioned method for manufacturing the TFT substrate involves a problem of increasing the manufacturing processes in which another insulating film is provided so as to prevent metal contamination in the channels made of the semiconductor films.

Further, in the case of eliminating the contacts with the pixel electrodes, a layout of the pixel electrodes is limited and there arises a problem that an aperture ratio is reduced. A method for unifying only a gate formation and doping has an advantage in that the number of masks can be reduced without changing the layout around the pixel electrodes, which has influence on the aperture ratio. However, conventionally, the method has not sufficed to stably form a channel length which affects TFT characteristics. Specifically, the use of a pattern which defines the boundaries of the sources, the drains, and the channels by using the boundaries of the opaque region of the half-tone mask, and variation in amount of regression at a time of resist ashing have caused a problem of inconstant channel length. For example, in the above-mentioned structural example shown in FIG. 19, the second metal film M2 for a gate PGT of the p-type TFT and the second metal film M2 for a gate NGT of the n-type TFT are formed by a pattern obtained by ashing of the resist pattern corresponding to the opaque region of the half-tone mask in the manufacturing process shown in FIG. 21D, and the second metal films M2 are affected by the amount of regression due to ashing of the resist pattern RST. Accordingly, dimension accuracy is degraded. Because the second metal film for the gate PGT corresponds to the channel PCH of the p-type TFT as shown in FIG. 22C, and the second metal film for the gate NGT corresponds to the channel NCH of the n-type TFT as shown in FIG. 21D, the dimension accuracy of the channel length is degraded.

Further, conventional methods have involved a problem that, in order to individually adjust the threshold values of the n-type TFT and the p-type TFT, another mask is required to adjust impurity concentrations for the channels even when the half-tone mask is used.

SUMMARY OF THE INVENTION

The present invention has an object to provide a method for manufacturing a TFT substrate, in which a half-tone mask is used to reduce the number of masks and, at the same time, the above-mentioned defects are eliminated.

In the present invention disclosed in the subject application, the outlines of representative aspects of the present invention are briefly described as follows.

(1) A method for manufacturing a thin film transistor substrate including thin film transistors, according to the present invention, for example,
each of the thin film transistors including:
a semiconductor film portion formed on an insulating substrate;
a gate insulating film portion laminated on the semiconductor film portion;
a gate made of a metal film portion formed on the gate insulating film portion; and
a channel formed in a region covered by the gate, which is formed of the semiconductor film portion,
the thin film transistor substrate including:
an n-type thin film transistor having regions of the semiconductor film portion, which are not covered by the gate and to which n-type impurities are doped, the regions becoming a source and a drain;
a p-type thin film transistor having regions of the semiconductor film portion, which are not covered by the gate and to which p-type impurities are doped, the regions becoming a source and a drain; and
a capacitor including:
a lower capacitor electrode formed in a region of another semiconductor film portion, to which the n-type impurities are doped, the another semiconductor film portion being formed on the same layer as the semiconductor film portion;
an upper capacitor electrode made of a metal film portion; and
another insulating film portion formed on the same layer as the gate insulating film portion to be interposed between the lower capacitor electrode and the upper capacitor electrode,
the method including:
processing the gate of the n-type thin film transistor, the gate of the p-type thin film transistor, and the upper capacitor electrode by using a first mask and a second mask; and
changing impurity concentrations of semiconductor film portions located in regions which become the channel of the n-type thin film transistor, the source and the drain of the n-type thin film transistor, the channel of the p-type thin film transistor, the source and the drain of the p-type thin film transistor, and the lower capacitor electrode, by using a pattern of the first mask and a pattern of the second mask,
the first mask being a half-tone mask having a transparent region, an opaque region, and a semitransparent region,
the second mask having a transparent region and an opaque region,
in which boundaries between the channel of the n-type thin film transistor and the source and the drain of the n-type thin film transistor, and boundaries between the channel of the p-type thin film transistor and the source and the drain of the p-type thin film transistor are defined by boundaries other than a boundary between the opaque region and the semitransparent region of the half-tone mask or a boundary between the opaque region and the transparent region of the half-tone mask.

According to the present invention, a pattern of the half-tone mask by which dimension accuracy is degraded is not used for the definition of the boundaries between the channels and the sources and drains, whereby channel lengths can be stably formed while the number of masks is reduced.

(2) A method for manufacturing a thin film transistor substrate including thin film transistors, according to the present invention, for example,
each of the thin film transistors including:
a semiconductor film portion formed on an insulating substrate;
a gate insulating film portion laminated on the semiconductor film portion;
a gate made of a metal film portion formed on the gate insulating film portion; and
a channel formed in a region covered by the gate, which is formed of the semiconductor film portion,
the thin film transistor substrate including:
an n-type thin film transistor having regions of the semiconductor film portion, which are not covered by the gate and to which n-type impurities are doped, the regions becoming a source and a drain;
a p-type thin film transistor having regions of the semiconductor film portion, which are not covered by the gate and to which p-type impurities are doped, the regions becoming a source and a drain; and
a capacitor including:
a lower capacitor electrode formed in a region of another semiconductor film portion, to which the n-type impurities are doped, the another semiconductor film portion being formed on the same layer as the semiconductor film portion;
an upper capacitor electrode made of a metal film portion; and
another insulating film portion formed on the same layer as the gate insulating film portion to be interposed between the lower capacitor electrode and the upper capacitor electrode,
the method including:
processing the gate of the n-type thin film transistor, the gate of the p-type thin film transistor, and the upper capacitor electrode by using a first mask and a second mask;
forming the channel of the n-type thin film transistor and the channel of the p-type thin film transistor in regions which are half-exposed with the first mask and unexposed with the second mask;
forming the source and the drain of the n-type thin film transistor in regions which are half-exposed with the first mask and exposed with the second mask;
forming the source and the drain of the p-type thin film transistor in regions which are exposed with the first mask and unexposed with the second mask; and forming the lower capacitor electrode in a region which is unexposed with the first mask and exposed with the second mask, the first mask being a half-tone mask having a transparent region, an opaque region, and a semitransparent region, the second mask having a transparent region and an opaque region.

(3) A method for manufacturing a thin film transistor substrate including thin film transistors, according to the present invention, for example, each of the thin film transistors including:

a semiconductor film portion formed on an insulating substrate; and a gate insulating film portion laminated on the semiconductor film portion, the thin film transistor substrate including:

an n-type thin film transistor including:

a first gate made of a metal film portion formed on the gate insulating film portion;

a channel formed in a region covered by the first gate, which is formed of the semiconductor film portion; and a source and a drain formed in regions of the semiconductor film portion, which are not covered by the first gate and to which n-type impurities are doped;

a p-type thin film transistor including:

a second gate made of a metal film portion formed on the gate insulating film portion;

a channel formed in a region covered by the second gate, which is formed of the semiconductor film portion; and a source and a drain formed in regions of the semiconductor film portion, which are not covered by the second gate and to which p-type impurities are doped; and a capacitor including:

a lower capacitor electrode formed in a region of another semiconductor film portion, to which the n-type impurities are doped, the another semiconductor film portion being formed on the same layer as the semiconductor film portion;

an upper capacitor electrode made of a metal film portion; and another insulating film portion formed on the same layer as the gate insulating film portion to be interposed between the lower capacitor electrode and the upper capacitor electrode, the method including:

processing the first gate of the n-type thin film transistor, the second gate of the p-type thin film transistor, and the upper capacitor electrode by using a first mask and a second mask;

forming the channel of the n-type thin film transistor in a region which is half-exposed with the first mask and unexposed with the second mask;

forming the source and the drain of the n-type thin film transistor in regions which are half-exposed with the first mask and exposed with the second mask;

forming the channel of the p-type thin film transistor in a region which is exposed with the first mask and unexposed with the second mask;

forming the source and the drain of the p-type thin film transistor in regions which are exposed with the first mask and exposed with the second mask; and forming the lower capacitor electrode in a region which is unexposed with the first mask and exposed with the second mask, the first mask being a half-tone mask having a transparent region, an opaque region, and a semitransparent region, the second mask having a transparent region and an opaque region.

According to this structure, there is also provided an effect of individually controlling impurity concentrations for the channels of the n-type TFT and the p-type TFT without increasing the number of masks.

(4) A method for manufacturing a thin film transistor substrate including thin film transistors, according to the present invention, for example, each of the thin film transistors including:

a semiconductor film portion formed on an insulating substrate; and a gate insulating film portion laminated on the semiconductor film portion, the thin film transistor substrate including:

an n-type thin film transistor including:

a first gate made of a metal film portion formed on the gate insulating film portion;

a channel formed in a region covered by the first gate, which is formed of the semiconductor film portion; and a source and a drain formed in regions of the semiconductor film portion, which are not covered by the first gate and to which n-type impurities are doped;

a p-type thin film transistor including:

a second gate made of a metal film portion formed on the gate insulating film portion;

a channel formed in a region covered by the second gate, which is formed of the semiconductor film portion; and a source and a drain formed in regions of the semiconductor film portion, which are not covered by the second gate and to which p-type impurities are doped; and a capacitor including:

a lower capacitor electrode formed in a region of another semiconductor film portion, to which the n-type impurities are doped, the another semiconductor film portion being formed on the same layer as the semiconductor film portion;

an upper capacitor electrode made of a metal film portion; and another insulating film portion formed on the same layer as the gate insulating film portion to be interposed between the lower capacitor electrode and the upper capacitor electrode, the method including:

processing the first gate of the n-type thin film transistor, the second gate of the p-type thin film transistor, and the upper capacitor electrode by using a first mask and a second mask;

forming the channel of the n-type thin film transistor in a region which is unexposed with the first mask and unexposed with the second mask;

forming the source and the drain of the n-type thin film transistor in regions which are unexposed with the first mask and exposed with the second mask;

forming the channel of the p-type thin film transistor in a region which is half-exposed with the first mask and unexposed with the second mask;

forming the source and the drain of the p-type thin film transistor in regions which are half-exposed with the first mask and exposed with the second mask; and forming the lower capacitor electrode in a region which is exposed with the first mask and unexposed with the second mask, the first mask being a half-tone mask having a transparent region, an opaque region, and a semitransparent region, the second mask having a transparent region and an opaque region.

According to this structure, there is also provided an effect of individually controlling impurity concentrations for the channels of the n-type TFT and the p-type TFT without increasing the number of masks.

(5) A method for manufacturing a thin film transistor substrate including thin film transistors, according to the present invention, for example, each of the thin film transistors including:
a semiconductor film portion formed on an insulating substrate; and
a gate insulating film portion laminated on the semiconductor film portion,
the thin film transistor substrate including:
an n-type thin film transistor including:
a first gate made of a metal film portion formed on the gate insulating film portion;
a channel formed in a region covered by the first gate, which is formed of the semiconductor film portion; and
a source and a drain formed in regions of the semiconductor film portion, which are not covered by the first gate and to which n-type impurities are doped;
a p-type thin film transistor including:
a second gate made of a metal film portion formed on the gate insulating film portion;
a channel formed in a region covered by the second gate, which is formed of the semiconductor film portion; and
a source and a drain formed in regions of the semiconductor film portion, which are not covered by the second gate and to which p-type impurities are doped; and
a capacitor including:
a lower capacitor electrode formed in a region of another semiconductor film portion, to which the n-type impurities are doped, the another semiconductor film portion being formed on the same layer as the semiconductor film portion;
an upper capacitor electrode made of a metal film portion; and
another insulating film portion formed on the same layer as the gate insulating film portion to be interposed between the lower capacitor electrode and the upper capacitor electrode,
the method including:
processing the first gate of the n-type thin film transistor, the second gate of the p-type thin film transistor, and the upper capacitor electrode by using a first mask and a second mask;
forming the channel of the n-type thin film transistor in a region which is half-exposed with the first mask and unexposed with the second mask;
forming the source and the drain of the n-type thin film transistor in regions which are half-exposed with the first mask and exposed with the second mask;
forming the channel of the p-type thin film transistor in a region which is unexposed with the first mask and unexposed with the second mask;

forming the source and the drain of the p-type thin film transistor in regions which are unexposed with the first mask and exposed with the second mask; and forming the lower capacitor electrode in a region which is exposed with the first mask and unexposed with the second mask, the first mask being a half-tone mask having a transparent region, an opaque region, and a semitransparent region, the second mask having a transparent region and an opaque region.

According to this structure, there is also provided an effect of individually controlling impurity concentrations for the channels of the n-type TFT and the p-type TFT without increasing the number of masks.

Note that the present invention is not limited to the above-mentioned structures, and various modifications can be made without departing from the technical idea of the present invention.

According to the method for manufacturing the TFT substrate according to the present invention, a pattern of the half-tone mask by which dimension accuracy is degraded is not used for the definition of the boundaries between the channels and the sources and drains, whereby channel lengths can be stably formed while the number of masks is reduced.

Further, according to the method for manufacturing the TFT substrate according to the present invention, impurity concentrations for the channels of the n-type TFT and the p-type TFT can be individually controlled without increasing the number of masks.

BRIEF DESCRIPTION OF THE DRAWINGS

In the accompanying drawings:

FIG. 19 is a view showing mask patterns used in a conventional method for manufacturing a TFT substrate, and showing the structure of the TFT substrate obtained by using the mask patterns;

FIG. 20 is a table showing correspondence relations between the mask patterns and respective regions of members formed on the TFT substrate shown in FIG. 19;

FIGS. 21A to 21D are process sectional views showing, together with FIGS. 22A to 22D, an example of the conventional method for manufacturing the TFT substrate;

FIGS. 22A to 22D are process sectional views showing, together with FIGS. 21A to 21D, the example of the conventional method for manufacturing the TFT substrate;

DETAILED DESCRIPTION OF THE INVENTION

Hereinafter, a method for manufacturing a TFT substrate according to the present invention is described with reference to the drawings.

First Embodiment

Figures 1, 2:
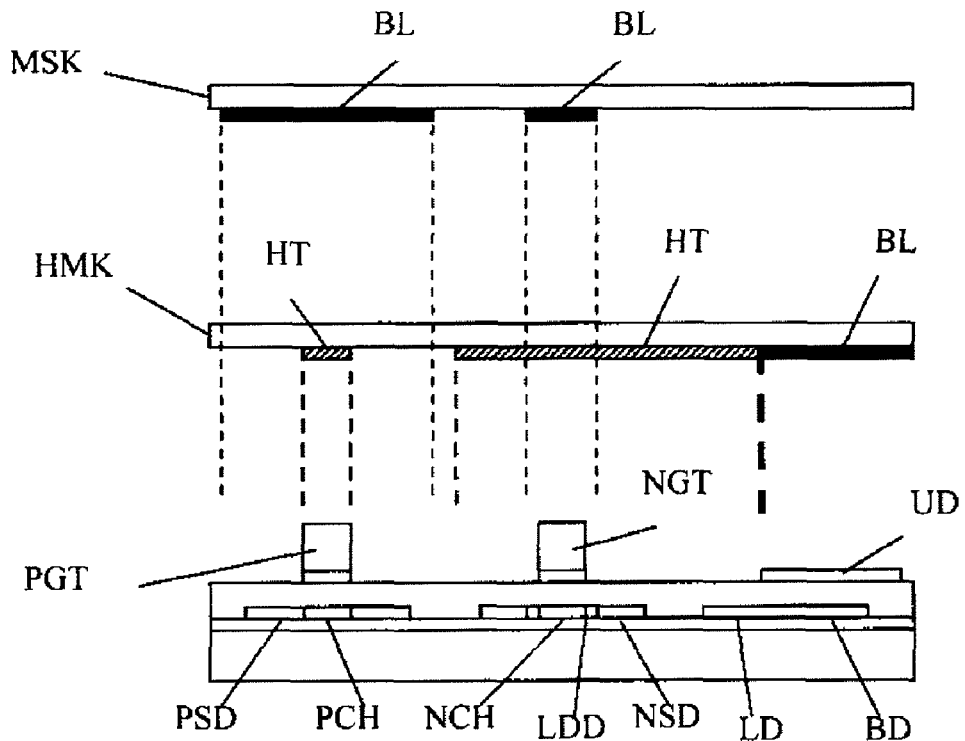
FIG. 1 is a view showing mask patterns used in a method for manufacturing a TFT substrate (in a first embodiment) according to the present invention, and showing the structure of the TFT substrate obtained by using the mask patterns.
FIG. 2 is a table showing correspondence relations between the mask patterns and respective regions of members formed on the TFT substrate shown in FIG. 1.

FIG. 1 is a view showing mask patterns used in a method for manufacturing a TFT substrate according to a first embodiment of the present invention, and showing the structure of the TFT substrate obtained by using the mask patterns.

In FIG. 1, there are used a total of two masks, that is, a normal mask MSK having a transparent region and an opaque region (indicated as BL in FIG. 1), and a half-tone mask HMK having a transparent region, a semitransparent region (indicated as HT in FIG. 1), and an opaque region (indicated as BL in FIG. 1). With the two masks, a source and drain PSD and a channel PCH of a p-type TFT, a source and drain NSD and a channel NCH of an n-type TFT, an upper capacitor electrode UD, and a lower capacitor electrode BD are separately formed.

FIG. 2 is a table showing correspondence relations between the mask patterns and respective regions of the members formed on the TFT substrate. In other words, FIG. 2 shows that the channel NCH of the n-type TFT and the channel PCH of the p-type TFT are formed in regions which are shielded from light through the opaque regions BL of the normal mask MSK to be unexposed, and are half-exposed through the semitransparent region HT of the half-tone mask HMK. FIG. 2 also shows that the source and drain NSD of the n-type TFT is formed in a region which is exposed through the transparent region of the normal mask MSK, and is half-exposed through the semitransparent region HT of the half-tone mask HMK. Note that, in this embodiment, a lead-out electrode LD, which is connected to the lower capacitor electrode and made of a semiconductor film not covered by the upper capacitor electrode, is formed through the same regions of the normal mask MSK and the half-tone mask HMK.

Further, FIG. 2 shows that the source and drain PSD of the p-type TFT is formed in a region which is shielded from light through the opaque region BL of the normal mask MSK to be unexposed, and is exposed through the transparent region of the half-tone mask HMK.

In this structure, the channel PCH of the p-type TFT is defined by the pattern of the semitransparent region HT of the half-tone mask HMK, and does not include the boundaries with the opaque region BL of the half-tone mask HMK. Further, the channel NCH of the n-type TFT is defined by the pattern of the opaque region BL of the normal mask MSK, and similarly to the channel PCH, the channel NCH does not include the boundaries with the opaque region BL of the half-tone mask HMK. Accordingly, there is no influence of resist pattern which is reduced in size at a time of ashing as described below, and an effect of suppressing the accuracy reduction of the channels.

Note that the TFT of this embodiment is a so-called lightly-doped drain (LDD) TFT, in which an n-type region LDD with a low concentration, which is not covered by a gate, is connected to each channel end of the n-type TFT, respectively. This is because the LDD TFT is excellent in breakdown voltage and has an advantage of causing less leak current.

FIGS. 3A to 3D, 4A to 4D, and 5A to 5F are process views showing an embodiment of the method for manufacturing the TFT substrate shown in FIG. 1. FIGS. 3A to 3D and 4A to 4D are sectional views, and FIGS. 5A to 5F are plan views.

First, polycrystalline Si films PSI are formed on a glass substrate GLS via an undercoat film UDC. For the undercoat film UDC, for example, there is used a laminated film of a silicon nitride film and a silicon oxide film which are deposited by plasma chemical vapor deposition (CVD). Each of the polycrystalline Si films PSI can be formed by a known method of forming an amorphous Si film made from silane by plasma CVD, and then crystallizing by laser. After the polycrystalline Si films PSI are processed by photolithography using another mask, a gate insulating film GI formed of a silicon oxide film is deposited by plasma CVD using tetra-ethyl-ortho-silicate (TEOS). The gate insulating film GI is set to have a thickness equal to or larger than 30 nm to equal to or smaller than 150 nm, and preferably about 100 nm. In addition, a first metal film M1 and a second metal film M2 are deposited by sputtering to obtain the structure shown in FIG. 3A and FIG. 5A. A Ti film or a TiN film is used as the first metal film M1, and a Mo film or a MoW alloy film is used as the second metal film M2. The first metal film M1 and the second metal film M2 should be made of combination of two metals, which can be individually etched. The thickness of the first metal film M1 is set to about 20 nm to 50 nm, and preferably about 30 nm. The thickness of the second metal film M2 is set to equal to or larger than 100 nm to equal to or smaller than 300 nm, and preferably about 200 nm. Note that, after or before the formation of the gate insulating film GI, impurities can be implanted into the polycrystalline Si films PSI so as to adjust a threshold value as necessary.

Figure 3A:
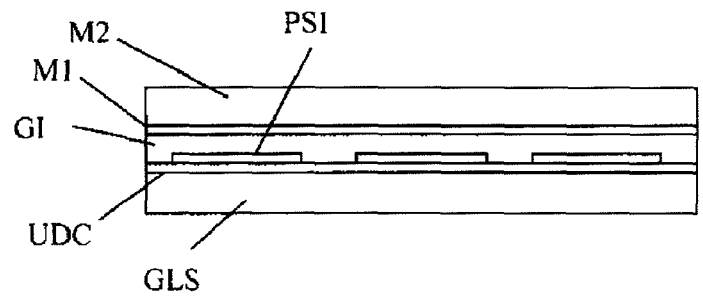
FIGS. 3A to 3D are process sectional views showing, together with FIGS. 4A to 4D, the method for manufacturing the TFT substrate according to the first embodiment of the present invention.
Figure 3B:
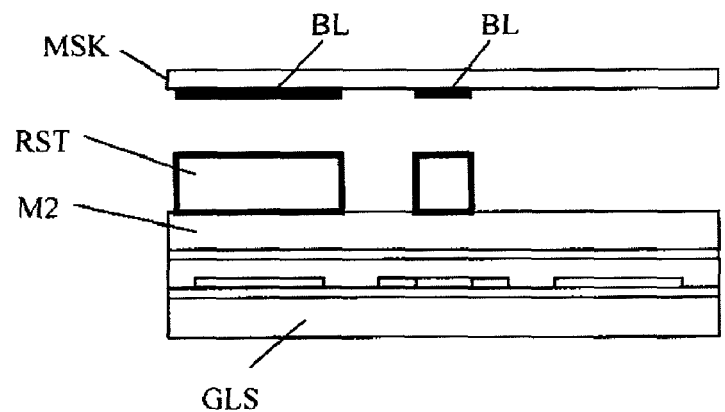
Figure 3C:
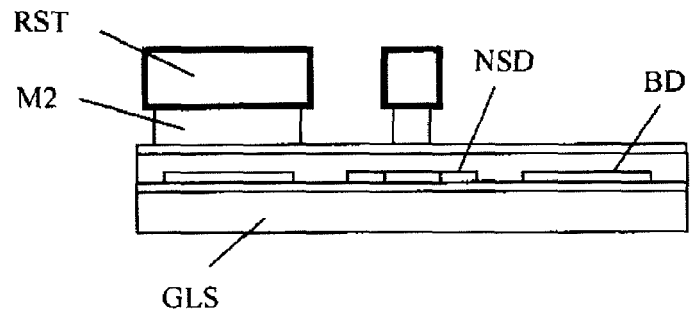
Figure 3D:
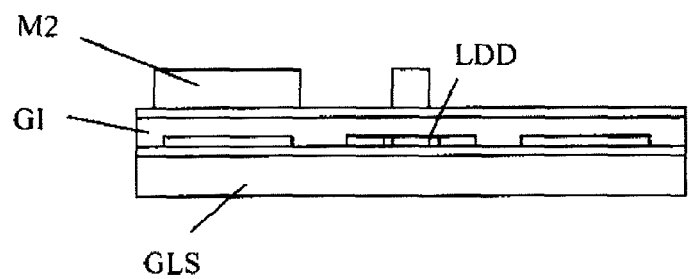
Figure 4A:
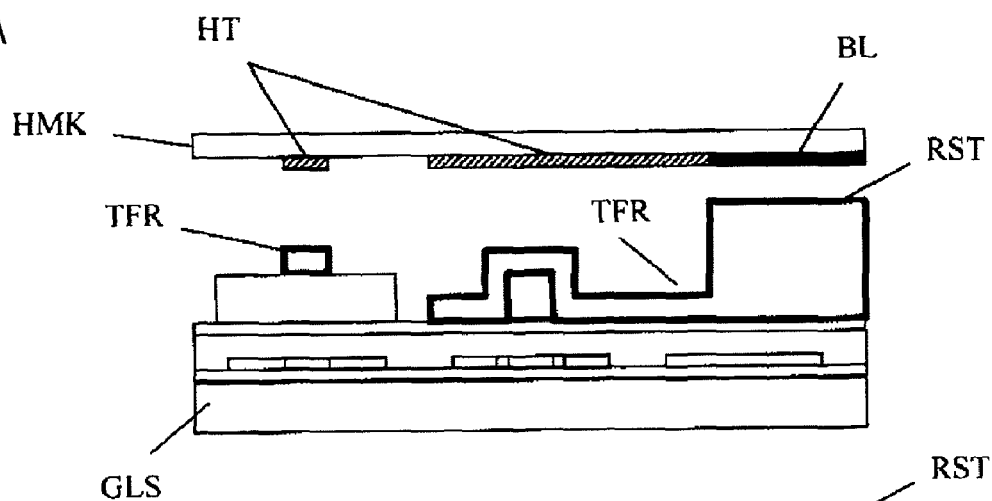
FIGS. 4A to 4D are process sectional views showing, together with FIGS. 3A to 3D, the method for manufacturing the TFT substrate according to the first embodiment of the present invention.
Figure 4B:
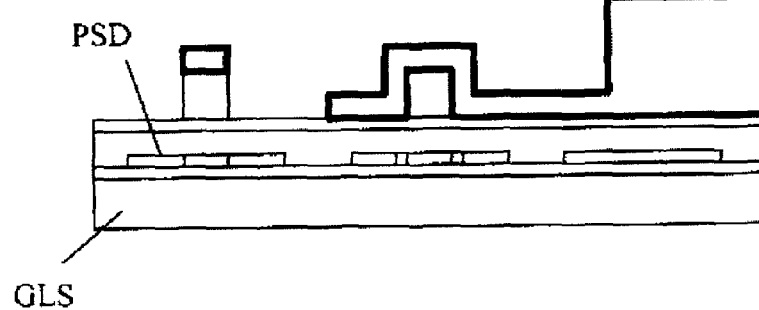
Figure 4C:
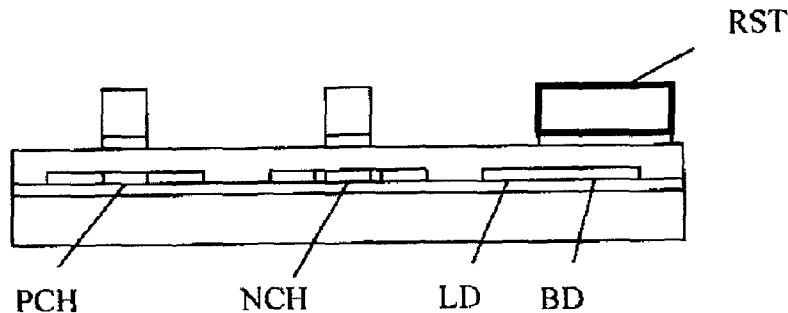
Figure 4D:
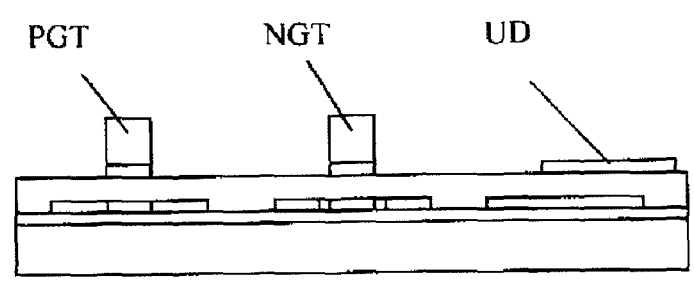
Figure 5A:
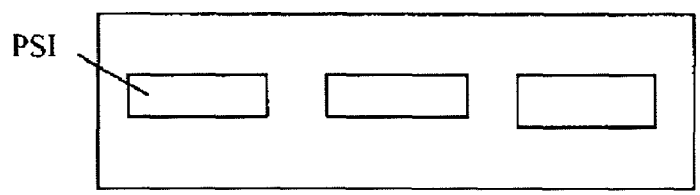
FIGS. 5A to 5F are process plan views showing the method for manufacturing the TFT substrate according to the first embodiment of the present invention.
Figure 5B:
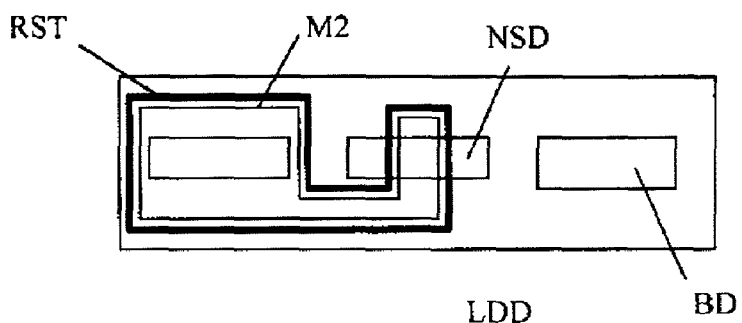
Figure 5C:
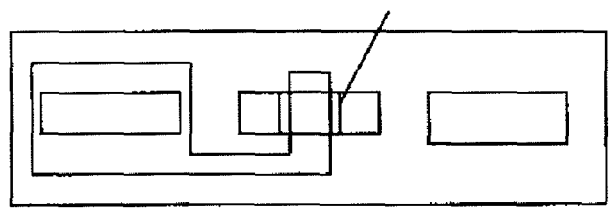
Figure 5D:
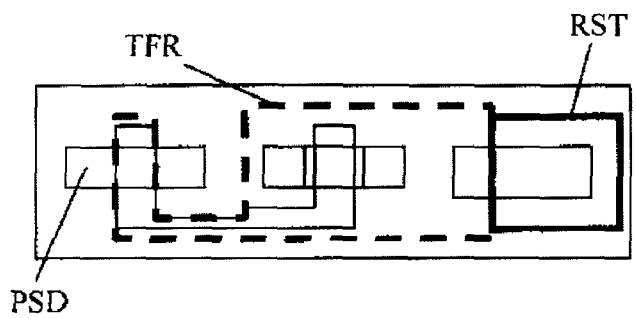
Figure 5E:
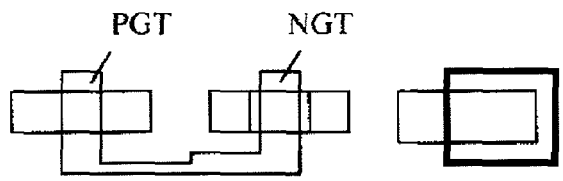
Figure 5F:
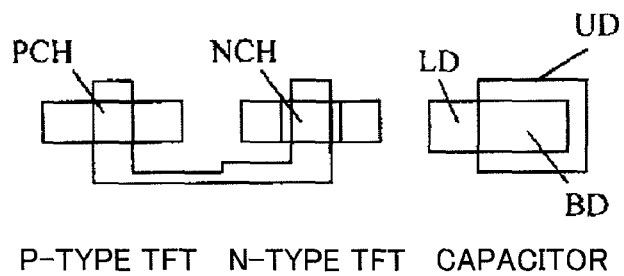

After a resist is applied, the resist is exposed and developed by using the normal mask MSK, thereby forming a resist pattern RST shown in FIG. 3B. The second metal film M2 is etched by using the resist pattern RST as a mask. For etching, wet etching in which a mixed solution of phosphoric acid and nitric acid is used can be performed. In this case, a technique called side etching is used for processing of the second metal film M2 so that the second metal film M2 is formed into a shape recessed from the resist pattern by about 1 µm. With the resist pattern RST being further used as a mask, n-type impurities are implanted into the polycrystalline Si films PSI which become the source and drain NSD of the n-type TFT and the lower capacitor electrode BD via the first metal film M1 and the gate insulating film GI, thereby obtaining the structure shown in FIGS. 3C and 5B. As the n-type impurities, phosphorus ions are accelerated to about 70 keV, and implanted at a dose of about $1\times10^{15}/cm^2$. After the resist is removed, phosphorus which becomes the n-type impurities is accelerated to about 80 keV and implanted at low concentration of a dose of about $1\times10^{13}/cm^2$. Then, the low concentration n-type region LDD is formed in the vicinity of each gate end of the n-type TFT, thereby obtaining the structure shown in FIGS. 3D and 5C. Subsequently, the half-tone mask HMK is used to form resist patterns having different thickness. Note that each of the resists used in this embodiment is a positive resist by which an exposed portion is removed. The resist in the semitransparent region HT of the half-tone mask HMK is half-exposed to partially leave the resist, thereby forming a thin-film resist pattern TFR. At the same time, a resist pattern RST having a normal thickness is formed in an unexposed region corresponding to the opaque region BL, thereby obtaining the structure shown in FIG. 4A. Next, the resist pattern TFR and the resist pattern RST are used as masks to etch the second metal film M2. Then, p-type impurities are implanted into a region which is exposed with the half-tone mask HMK and on which a resist pattern is not formed, and the source and drain PSD of the p-type TFT is formed, thereby obtaining the structure shown in FIGS. 4B and 5D. Boron (B) is used as the p-type impurities and implanted at an accelerating voltage of about 30 keV and at a dose of about $1\times10^{15}/cm^2$. In this embodiment, since the n-type impurities are not implanted into the source and drain PSD of the p-type TFT, the dose of the p-type impurities and the dose of the n-type impurities are independently determined, resulting in an advantage of reducing implantation dose. After the resist is subjected to ashing and the thin-film resist pattern is removed, the first metal film M1 is etched as shown in FIGS. 4C and 5E, whereby a gate PGT of the p-type TFT, a gate NGT of the n-type TFT, and an upper capacitor electrode UD are formed. For ashing, plasma ashing which uses a gas containing oxygen is employed, and an ashing time is adjusted so that only the thin-film resist is opened. Dry etching is performed as etching for the first metal film M1, and the second metal film M2 and the thick-film resist RST which is left after ashing are used as masks. After the processing, the resist is removed to obtain the structure shown in FIGS. 4D and 5F, thereby forming the n-type TFT, the p-type TFT, and the capacitor.

According to the above-mentioned embodiment, the processing of the gates, the sources, and the drains of the n-type TFT and the p-type TFT, and the capacitor electrodes, which is conventionally performed by using three masks, can be performed by using only the two masks. Further, there is not used, for the channels of the TFTs, a pattern obtained from the opaque region of the half-tone mask in which a resist pattern shrinks at a time of ashing. Therefore, accuracy reduction of the channel lengths is suppressed, and the TFT having uniform characteristics can be manufactured.

Figure 23:
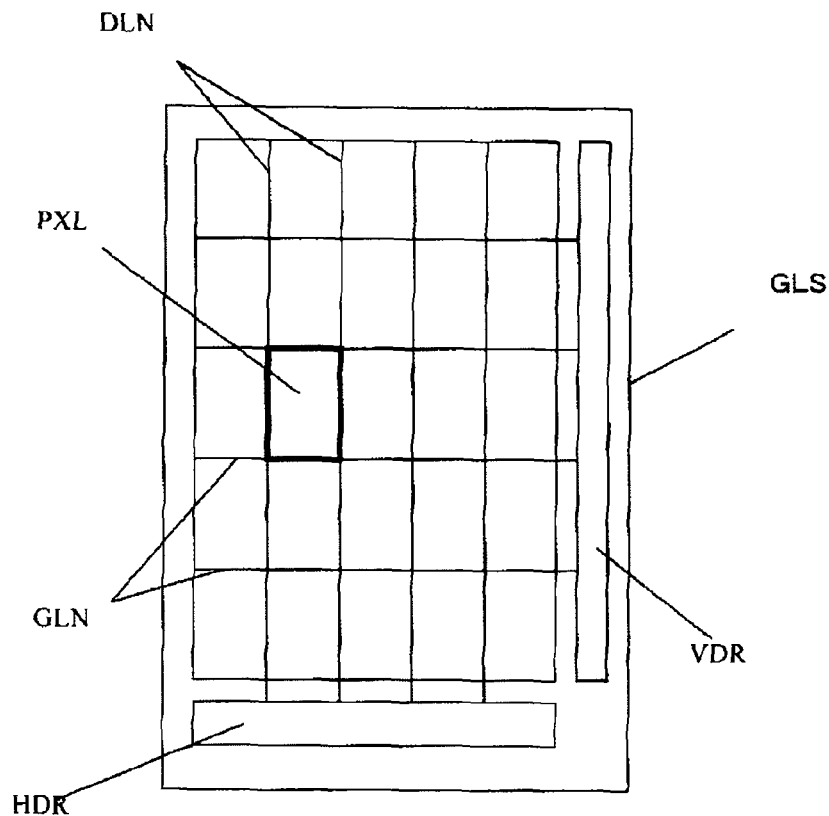
FIG. 23 is a plan view showing an embodiment of a TFT substrate manufactured according to the present invention.
Figure 24:
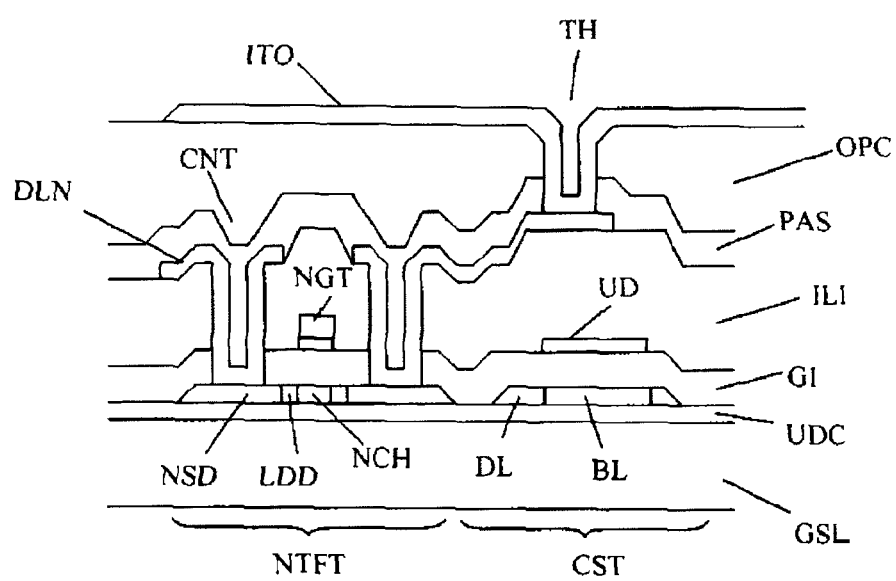
FIG. 24 is a sectional view showing the embodiment of a pixel portion of the TFT substrate shown in FIG. 23.
Figure 25:
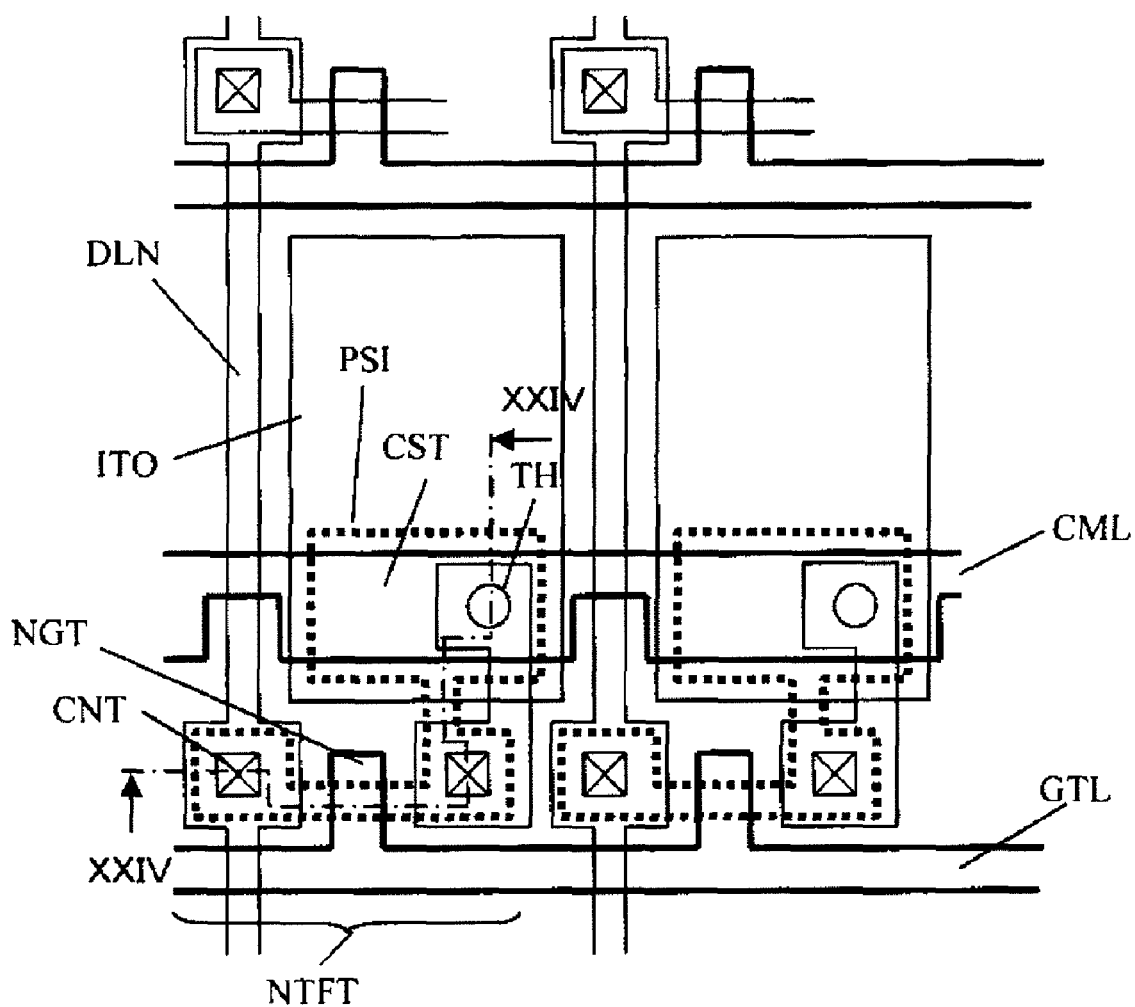
FIG. 25 is a plan view showing the embodiment of the pixel portion of the TFT substrate shown in FIG. 23.

FIGS. 23 to 25 show an example of a TFT substrate for a liquid crystal display apparatus, which is manufactured by the method for manufacturing the TFT substrate according to the present invention.

As shown in FIG. 23, a plurality of pixels PXL for displaying an image are formed in matrix on the glass substrate GLS, and a gate line GLN and a drain line DLN for individually driving each of the pixels are formed. A scanning circuit VDR for driving the pixels and a signal line driving circuit HDR for distributing video signals are formed by using the TFTs in the same manner. The n-type and p-type TFTs are used for the scanning circuit VDR and the signal line driving circuit HDR. Further, for example, the n-type TFT and the capacitor are formed for each of the pixels.

FIG. 24 is a sectional view of a pixel portion, and FIG. 25 is a plan view of the pixels. FIG. 24 shows a cross section of a portion obtained by taking along the line XXIV-XXIV shown in FIG. 25.

As shown in FIG. 24, an NTFT which is the n-type TFT according to the present invention and a capacitor CST are formed on the glass substrate GLS. After the process shown in FIG. 4D, an interlayer insulating film ILI is deposited and a contact hole CNT is formed by photolithography technology. Further, wiring DLN is formed to be connected to the drain NSD of the NTFT. An inorganic protective film PAS made of a SiN film is formed, and then an organic protective film OPC made of a photosensitive organic film is formed to thereby form a through hole TH in the inorganic protective film PAS. Finally, a transparent electrode made of indium-tin-oxide (ITO) is formed by sputtering to be processed into a pixel electrode ITO, thereby obtaining the TFT substrate having the structure shown in FIG. 24. The method according to the present invention is not different from conventional manufacturing methods for the deposition process of the interlayer insulating film ILI and the subsequent processes, and the shape of the pixel electrode is made the same as in the conventional methods. Accordingly, reduction of the aperture ratio involving the reduced number of masks is suppressed.

Second Embodiment

Figures 6, 7:
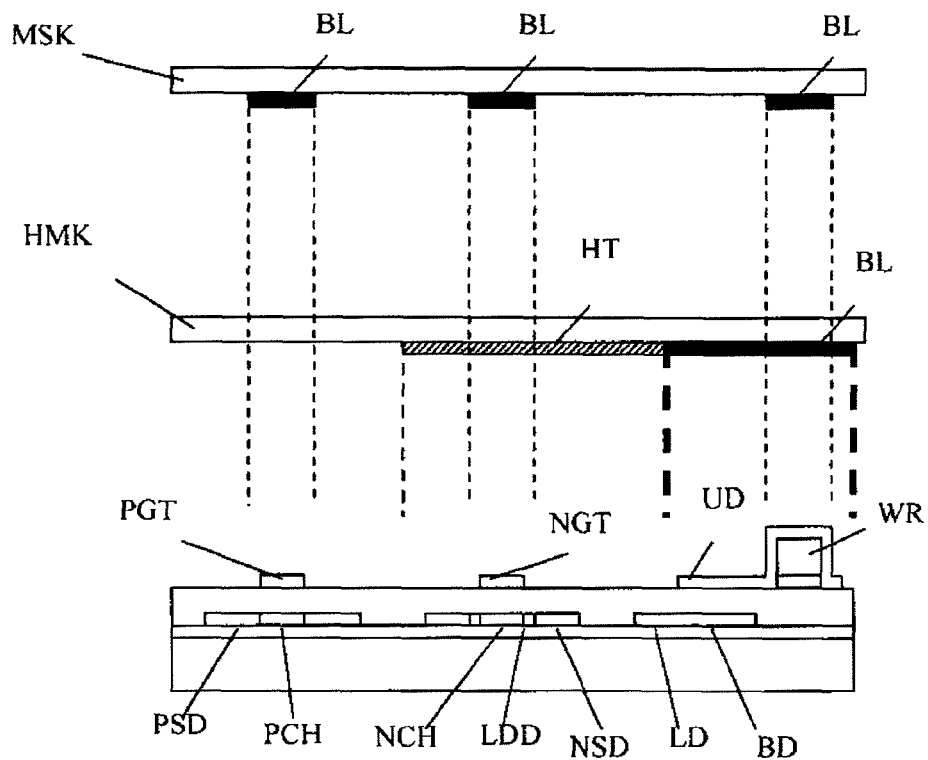
FIG. 6 is a view showing mask patterns used in a method for manufacturing a TFT substrate (in a second embodiment) according to the present invention, and showing the structure of the TFT substrate obtained by using the mask patterns.
FIG. 7 is a table showing correspondence relations between the mask patterns and respective regions of members formed on the TFT substrate shown in FIG. 6.

FIG. 6 is a view showing mask patterns used in a method for manufacturing a TFT substrate according to a second embodiment of the present invention, and showing the structure of the TFT substrate obtained by using the mask patterns. FIG. 7 is a table showing correspondence relations between the mask patterns and respective regions of members formed on the TFT substrate.

In FIG. 6, a channel PCH of a p-type TFT is formed in a region which is unexposed through an opaque region BL of a normal mask MSK and is exposed through a transparent region of a half-tone mask HMK.

A channel NCH of an n-type TFT is formed in a region which is unexposed through the opaque region BL of the normal mask MSK and is half-exposed through a semitransparent region HT of the half-tone mask HMK.

A source and drain PSD of the p-type TFT is formed in a region which is exposed through a transparent region of the normal mask MSK and is exposed through the transparent region of the half-tone mask HMK.

A source and drain NSD of the n-type TFT is formed in a region which is exposed through the transparent region of the normal mask MSK and is half-exposed through the semitransparent region HT of the half-tone mask HMK. Note that a lead-out electrode LD is formed through the same regions of the normal mask MSK and the half-tone mask HMK.

A lower capacitor electrode BD is formed in a region which is exposed through the transparent region of the normal mask MSK and is unexposed through an opaque region BL of the half-tone mask HMK. Note that, in this embodiment, wiring WR is formed in a region which is unexposed with both the normal mask MSK and the half-tone mask HMK.

In this embodiment, both the channel PCH of the p-type TFT and the channel NCH of the n-type TFT are obtained through the opaque region BL of the normal mask MSK, and do not include the boundaries between the opaque region and the semitransparent region or between the opaque region and the transparent region of the half-tone mask HMK in which the pattern is affected by regression of the resist at a time of ashing. Accordingly, lowering of dimension accuracy of the channel lengths is suppressed.

FIGS. 8A to 8E, 9A to 9D, and 10A to 10G show an example of a method for manufacturing the TFT substrate having the structure shown in FIG. 6. FIGS. 8A to 8E and 9A to 9D are sectional views, and FIGS. 10A to 10G are plan views. Similarly to the first embodiment of the present invention, semiconductor films PSI made of polycrystalline Si films are formed in a plurality of regions of a glass substrate GLS via an undercoat film UDC. Thereon, a gate insulating film GI, a first metal film M1, and a second metal film M2 are laminated in the stated order, thereby obtaining the structure shown in FIGS. 8A and 10A. Note that, after or before the gate insulating film GI is formed, impurities are implanted into the semiconductor films PSI so as to adjust a threshold value for the n-type TFT.

Figure 8A:
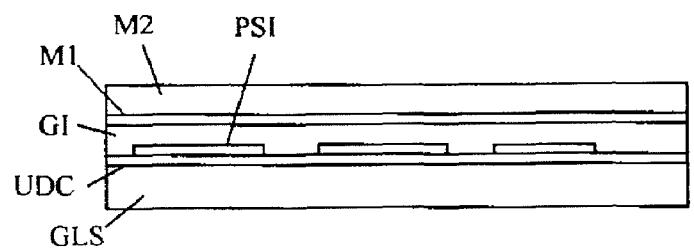
FIGS. 8A to 8E are process sectional views showing, together with FIGS. 9A to 9D, the method for manufacturing the TFT substrate according to the second embodiment of the present invention.
Figure 8B:
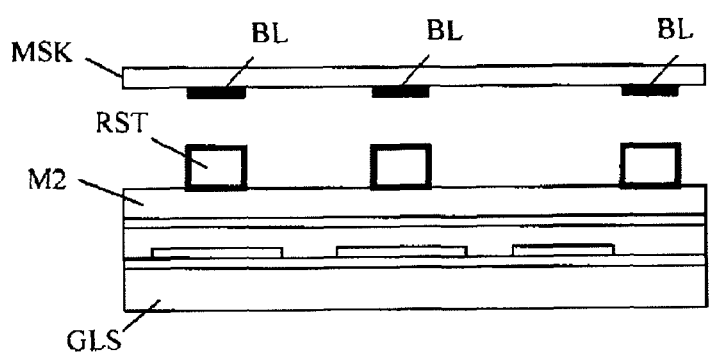
Figure 8C:
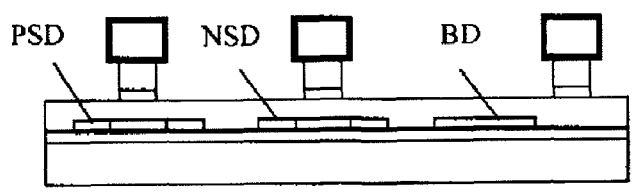
Figure 8D:
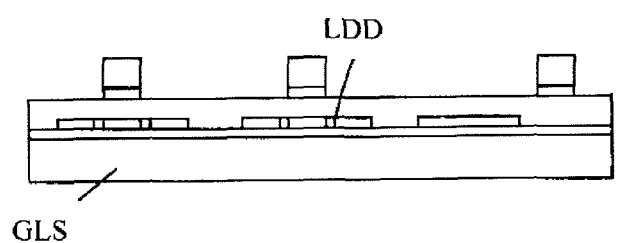
Figure 8E:
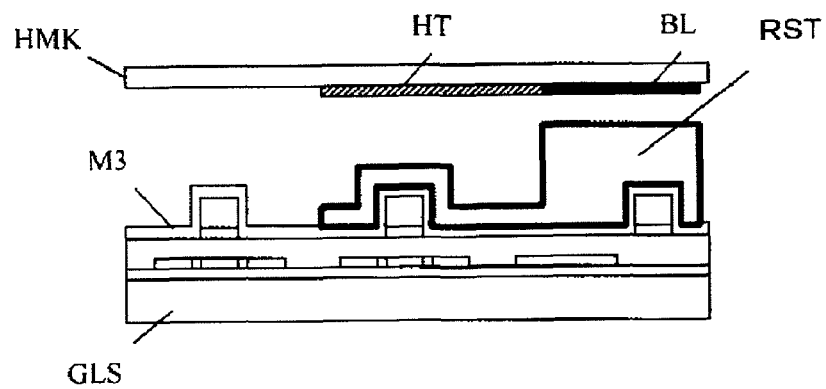
Figure 9A:
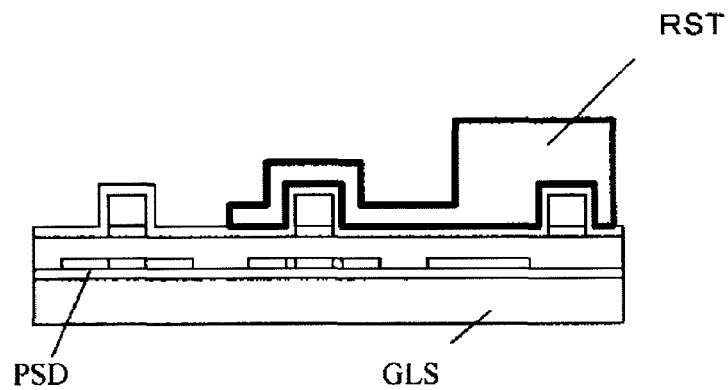
FIGS. 9A to 9D are process sectional views showing, together with FIGS. 8A to 8E, the method for manufacturing the TFT substrate according to the second embodiment of the present invention.
Figure 9B:
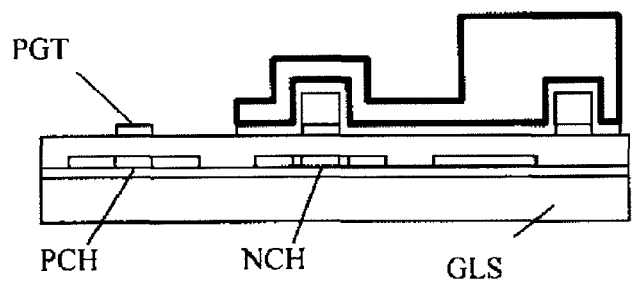
Figure 9C:
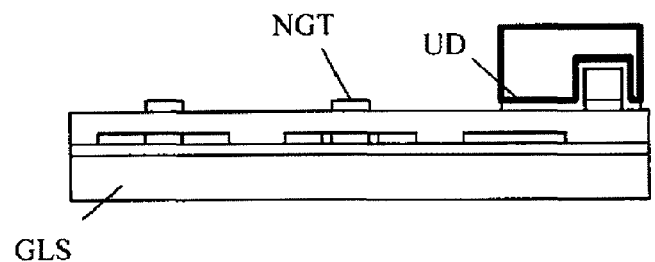
Figure 9D:
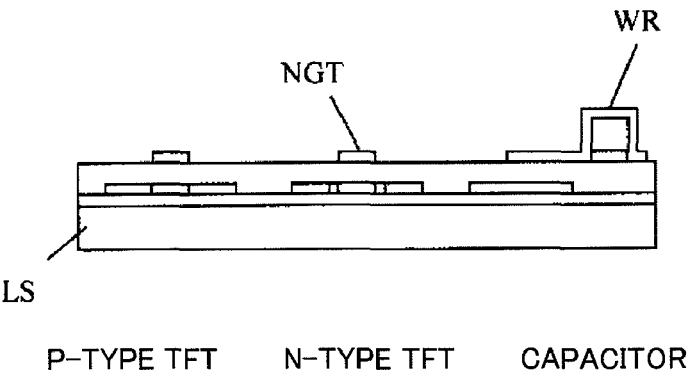
Figure 10A:
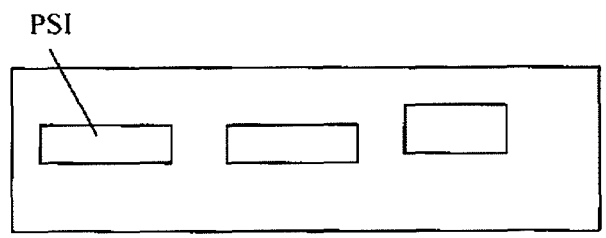
FIGS. 10A to 10G are process plan views showing the method for manufacturing the TFT substrate according to the second embodiment of the present invention.
Figure 10B:
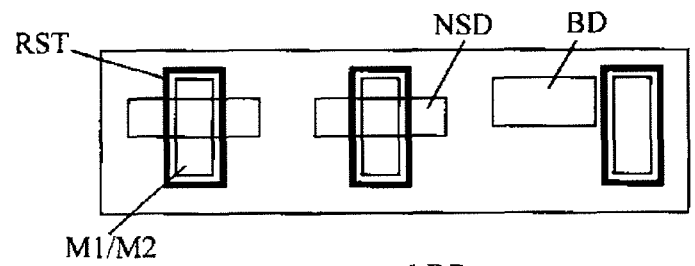
Figure 10C:
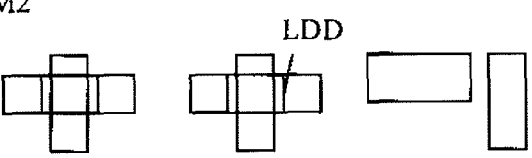
Figure 10D:
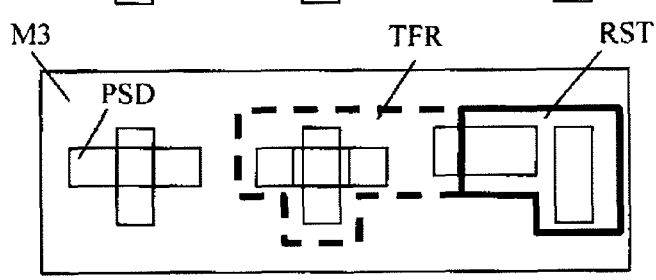
Figure 10E:
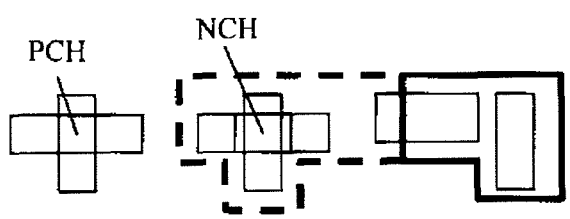
Figure 10F:
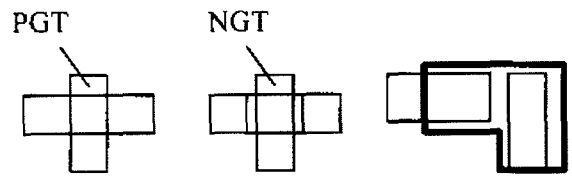
Figure 10G:
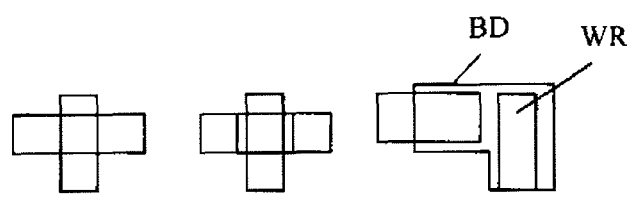

A resist pattern RST is formed by using the normal mask MSK to obtain the structure shown in FIG. 8B. The second metal film M2 and the first metal film M1 are processed by using the resist pattern RST as a mask. In this case, the second metal film M2 and the first metal film M1 are processed into a shape recessed from the resist pattern RST. N-type impurities are implanted with the use of the resist pattern RST as a mask, and the source and drain NSD of the n-type TFT and the lower capacitor electrode BD are formed, thereby obtaining the structure shown in FIGS. 8C and 10B. In this stage, the n-type impurities are also implanted into the source and drain PSD of the p-type TFT. After the removal of the resist, the n-type impurities are implanted at low concentration, and a low concentration impurity regions LDD are formed in regions in which the second metal film M2 and the first metal film M1 are recessed from the resist pattern RST, thereby obtaining the structure shown in FIGS. 8D and 10C. Further, a third metal film M3 is formed by sputtering, and a resist pattern RST' having a different thickness is formed by using the half-tone mask HMK, thereby obtaining the structure shown in FIG. 8E. Through the third metal film M3 and the gate insulating film GI, p-type impurities are implanted by using the second metal film M2 and the resist pattern RST' as masks, and the source and drain PSD of the p-type TFT is formed, thereby obtaining the structure shown in FIGS. 9A and 10D. A dose of the p-type impurities is larger than a dose corresponding to the concentration of the n-type impurities implanted when the source and drain NSD of the n-type TFT is formed in FIG. 8C, and is adjusted so that the source and drain PSD becomes p-type. For example, a dose of the n-type impurities is set to $1 \times 10^{15}/cm^2$, and a dose of the p-type impurities is set to $2 \times 10^{15}/cm^2$. The third metal film M3 is set to, for example, a thickness of 30 nm of Mo so that the p-type impurities can permeate. Further, the third metal film M3 and the second metal film M2 are etched to form a gate PGT of the p-type TFT, the gate PGT being formed only of the first metal film M1. After that, the n-type impurity implantation for adjusting a threshold value of the p-type TFT is performed on the channel PCH at low concentration via the first metal film M1 and the gate insulating film GI, thereby obtaining the structure shown in FIGS. 9B and 10E. The dose is set to much smaller than the dose at the time of forming the LDD, for example, set to $2 \times 10^{12}/cm^2$. The resist is subjected to ashing to remove a thin-film resist portion. Further, the third metal film M3 and the second metal film M2 are removed to form a gate NGT of the n-type TFT, which is formed only of the first metal film M1, and at the same time, an upper capacitor electrode UD formed of the third metal film M3 is formed, thereby obtaining the structure shown in FIGS. 9C and 10F. The resist is removed and the structure shown in FIGS. 9D and 10G, in which the p-type TFT, the n-type TFT, and the capacitor are formed, is obtained. At the same time, wiring WR which is formed by lamination of the first metal film M1, the second metal film M2, and the third metal film M3 can be formed in this embodiment, whereby the wiring WR can be employed as low resistance wiring. Note that the TFT substrate thus obtained can be used as a TFT substrate for a liquid crystal display by forming similar wiring and pixel electrodes as shown in FIG. 24 after the process shown in FIG. 9D.

In this embodiment, there is provided an advantage in that the threshold values of the p-type TFT and the n-type TFT can be individually adjusted by implanting the impurities having the different concentrations into the p-type channel and the n-type channel, without increasing the number of masks compared with the first embodiment of the present invention.

Third Embodiment

Figures 11, 12:
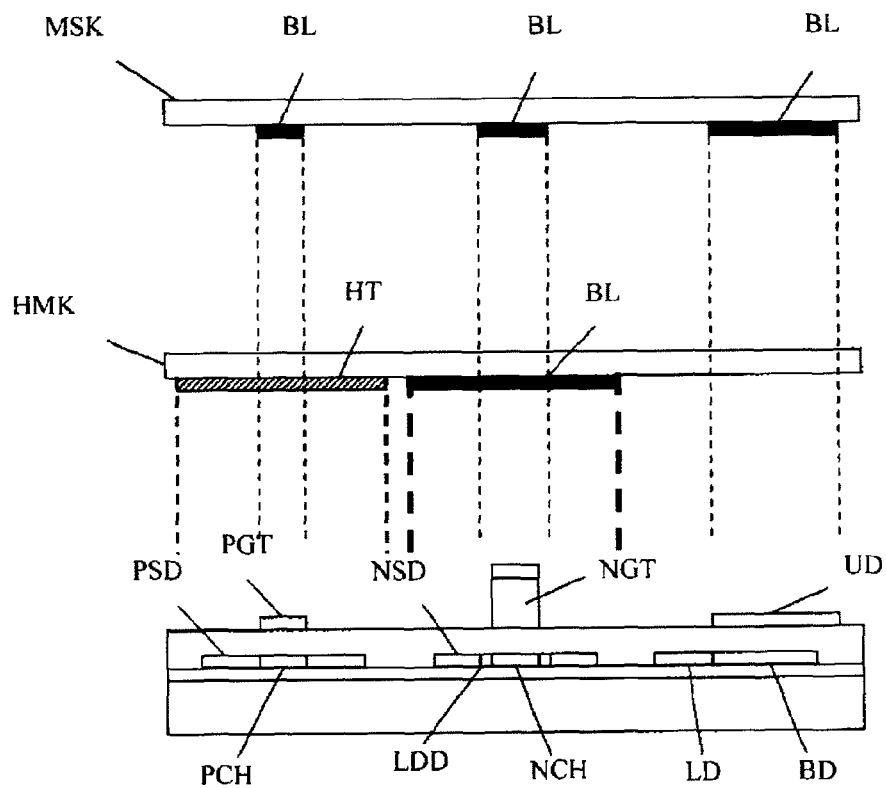
FIG. 11 is a view showing mask patterns used in a method for manufacturing a TFT substrate (in a third embodiment) according to the present invention, and showing the structure of the TFT substrate obtained by using the mask patterns.
FIG. 12 is a table showing correspondence relations between the mask patterns and respective regions of members formed on the TFT substrate shown in FIG. 11.

FIG. 11 is a view showing mask patterns used in a method for manufacturing a TFT substrate according to a third embodiment of the present invention, and showing the structure of the TFT substrate obtained by using the mask patterns. FIG. 12 is a table showing correspondence relations between the mask patterns and respective regions of members formed on the TFT substrate.

In FIG. 11, a channel PCH of a p-type TFT is formed in a region which is unexposed through an opaque region BL of a normal mask MSK and is half-exposed through a semitransparent region HT of a half-tone mask HMK. Further, a channel NCH of an n-type TFT is formed in a region which is unexposed through the opaque region BL of the normal mask MSK and is unexposed through an opaque region BL of the half-tone mask HMK. A source and drain PSD of the p-type TFT is formed in a region which is exposed through a transparent region of the normal mask MSK and is half-exposed through the semitransparent region HT of the half-tone mask HMK. A source and drain NSD of the n-type TFT is formed in a region which is exposed through the transparent region of the normal mask MSK and is unexposed through the opaque region BL of the half-tone mask HMK. Further, a lower capacitor electrode BD is formed in a region which is unexposed through the opaque region BL of the normal mask MSK and is exposed through a transparent region of the half-tone mask HMK. Note that a lead-out electrode LD, which is connected to the lower capacitor electrode BD and made of a semiconductor film not covered by an upper capacitor electrode UD, is formed in a region which is exposed through both the transparent region of the normal mask MSK and the transparent region of the half-tone mask HMK.

In this embodiment as well, the channel PCH of the p-type TFT and the channel NCH of the n-type TFT are defined by the opaque region of the normal mask MSK, and do not include the boundaries between the opaque region and the transparent region or between the opaque region and the semitransparent region of the half-tone mask HMK. Accordingly, an effect of stabilizing a channel dimension is produced without being affected by a resist deformation at a time of ashing.

FIGS. 13A to 13D and 14A to 14D are views showing the method for manufacturing the TFT substrate shown in FIG. 11.

Figure 13A:
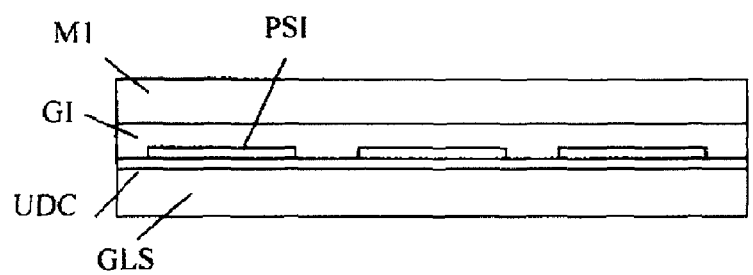
FIGS. 13A to 13D are process sectional views showing, together with FIGS. 14A to 14D, the method for manufacturing the TFT substrate according to the third embodiment of the present invention.
Figure 13B:
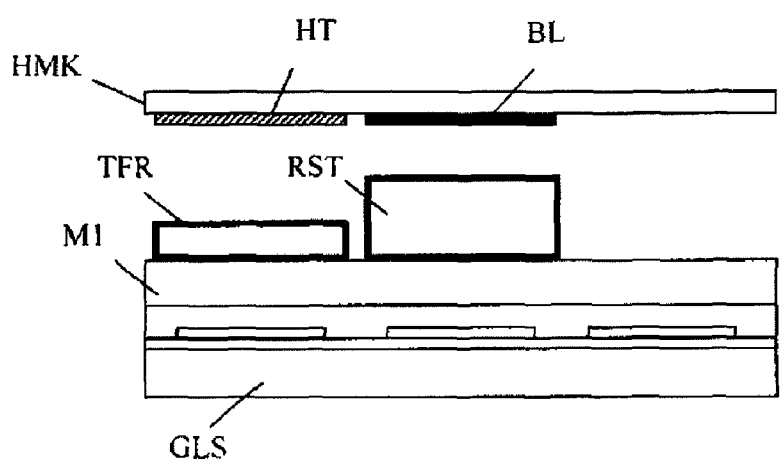
Figure 13C:
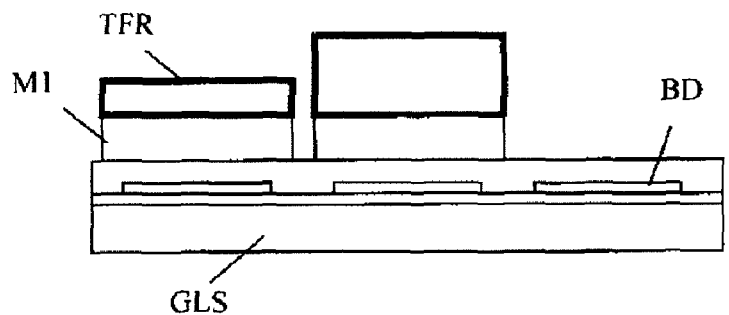
Figure 13D:
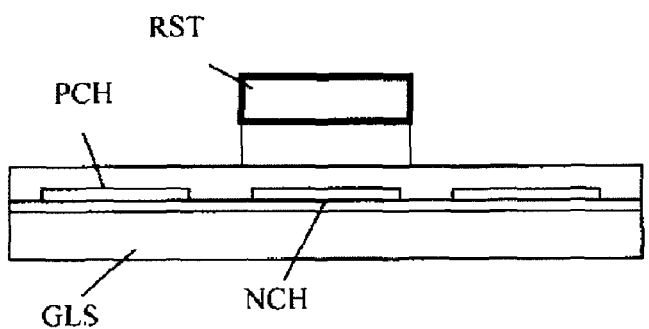

First, FIG. 13A shows a state in which semiconductor films PSI made of polycrystalline Si films are formed on a glass substrate GLS via an undercoat film UDC, and thereon, a gate insulating film GI and a first metal film M1 are laminated. Note that, as necessary, p-type impurities are implanted into the polycrystalline Si films PSI at low concentration so as to adjust a threshold value of the n-type TFT before the formation of the first metal film M1. Subsequently, with the use of the half-tone mask HMK, a thin-film resist pattern TFR is formed in the region which is half-exposed through the semi-transparent region HT of the half-tone mask HMK, and a thick-film resist pattern RST is formed in the region which is unexposed through the opaque region BL thereof, respectively, thereby obtaining the structure shown in FIG. 13B. The first metal film M1 is etched using the resists as masks, and the n-type impurities are implanted using the resists and the first metal film M1 as masks, to thereby perform first n-type impurity implantation on the lower capacitor electrode BD. The first metal film M1 is formed of a refractory metal having a thickness of about 200 nm so as to be a mask in the impurity implantation. Further, after ashing is performed to remove the thin-film resist, the first metal film M1 is etched again, and, for adjusting the threshold value of the p-type TFT, n-type impurities are implanted at low concentration into the region which becomes the channel PCH of the p-type TFT, thereby obtaining the structure shown in FIG. 13D. After the thick-film resist is removed and a second metal film M2 is laminated by sputtering, a resist pattern RST is formed with the use of the normal mask MSK, thereby obtaining the structure shown in FIG. 14A. With the use of the resist pattern RST and the first metal film M1 as masks, p-type impurities are implanted via the second metal film M2 and the gate insulating film GI, and the source and drain PSD of the p-type TFT is formed, thereby obtaining the structure shown in FIG. 14B. In this case, the p-type impurities are also implanted into a region which becomes the lead-out electrode LD. Note that a thin metal film having a thickness of about 50 nm is used for the second metal film M2 so as to have permeability with respect to the implanted p-type impurities.

Further, with the use of the resist as a mask, the second metal film M2 and the first metal film M1 are etched. The second metal film M2 and the first metal film M1 are simultaneously etched, and the second metal film M2 is processed into a shape recessed from the resist. For example, the first metal film M1 and the second metal film M2 can be formed of a MoW alloy, and processed with an etchant containing phosphoric acid and nitric acid. With the use of the resist as a mask, second n-type impurity implantation is performed to form the source and drain NSD of the n-type TFT, thereby obtaining the structure shown in FIG. 14C. In this case, the n-type impurities are also implanted into the region which becomes the lead-out electrode LD and into the region which becomes the source and drain PSD of the p-type TFT. In order to set the source and drain PSD of the p-type TFT to be p-type, a dose for the second n-type impurity implantation is set to be smaller than a dose for the p-type impurity implantation. Further, in order to set the lead-out electrode LD to be n-type similarly to the lower capacitor electrode BD, the sum of a dose for the first n-type impurity implantation and the dose for the second n-type impurity implantation is set to be larger than the dose for the p-type impurity implantation. For example, when the dose for the first n-type impurity implantation is set to $1\times10^{15}/cm^2$, the dose for the second n-type impurity implantation is set to $5\times10^{14}/cm^2$, and the dose for the p-type impurity implantation is set to $1\times10^{15}/cm^2$, the source and drain NSD of the n-type TFT is doped with the n-type impurities of $5\times10^{4}/cm^2$ to become n-type, the source and drain PSD of the p-type TFT is doped with the n-type impurities of $5\times10^{4}/cm^2$ and with the p-type impurities of $1\times10^{15}/cm^2$ to become p-type, and the lead-out electrode LD is doped with the n-type impurities of $1.5\times10^{15}/cm^2$ through the first and second n-type impurity implantations and with the p-type impurities of $1\times10^{15}/cm^2$ to become n-type, respectively.

Figure 14A:
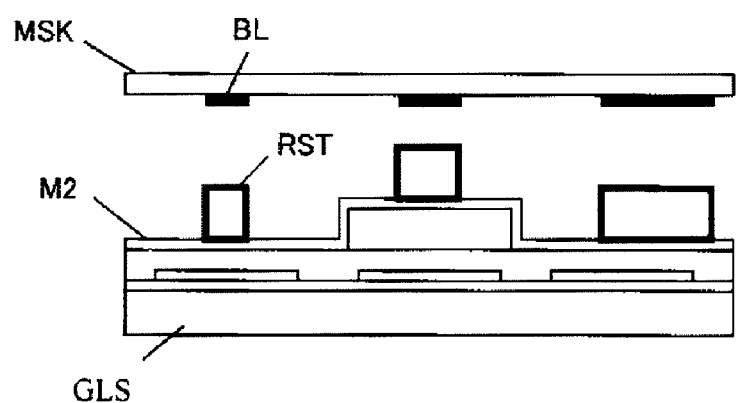
FIGS. 14A to 14D are process sectional views showing, together with FIGS. 13A to 13D, the method for manufacturing the TFT substrate according to the third embodiment of the present invention.
Figure 14B:
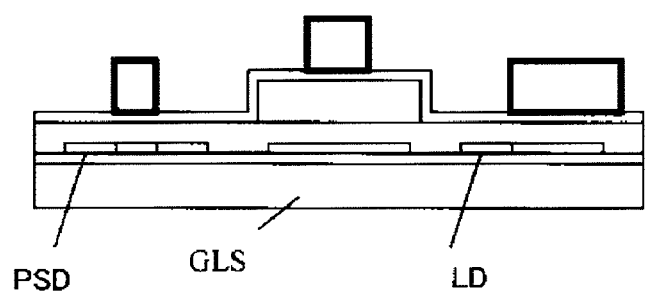
Figure 14C:
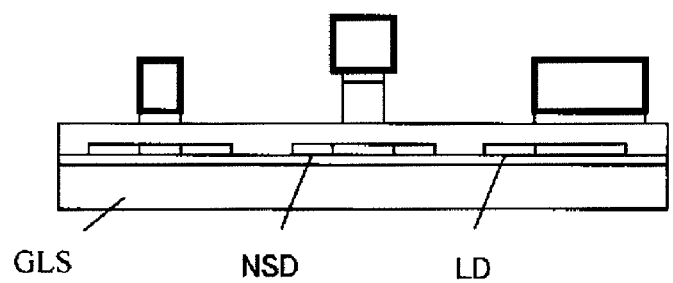
Figure 14D:
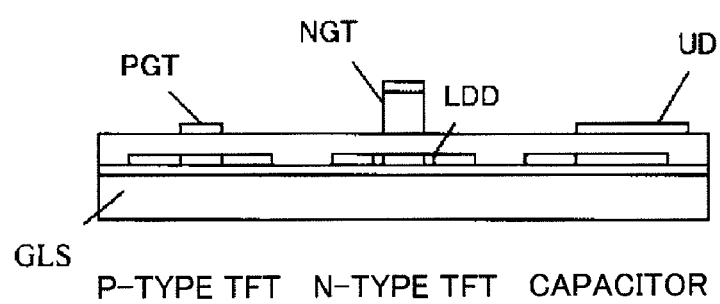

Further, after the resist is removed, the n-type impurities are implanted over the entire surface at low acceleration and at low concentration while the first metal film M1 and the second metal film M2 are used as masks, and a low concentration impurity region LDD is formed near each channel end of the n-type TFT, thereby obtaining the structure shown in FIG. 14D. At this time, an accelerating voltage for the n-type impurity implantation is adjusted so as to be shielded by the second metal film M2 as well. For example, in a case where phosphorus ions are implanted into the gate insulating film having a thickness of 100 nm and into the second metal film formed of the MoW alloy having a thickness of 50 nm, an accelerating voltage is set to about 50 keV.

In this embodiment as well, both the channel PCH of the p-type TFT and the channel NCH of the n-type TFT are defined by the opaque region of the normal mask, and do not include the boundaries between the opaque region and the semitransparent region or between the opaque region and the transparent region of the half-tone mask. Accordingly, pattern accuracy is not affected and not lowered by regression of the resist due to ashing. Further, also in this embodiment, there is produced an advantage in that the threshold values of the p-type TFT and the n-type TFT can be individually adjusted with the same number of masks as in the first embodiment of the present invention. In addition, similarly to the first and second embodiments of the present invention, there is produced an effect of achieving a TFT substrate for a liquid crystal display by adding a wiring process.

Fourth Embodiment

Figures 15, 16:
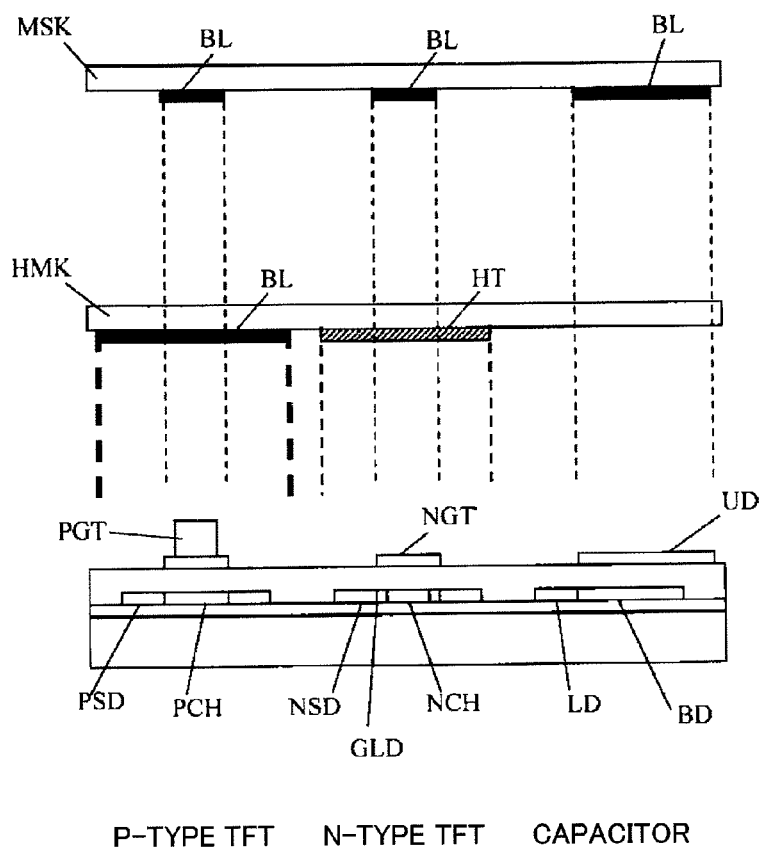
FIG. 15 is a view showing mask patterns used in a method for manufacturing a TFT substrate (in a fourth embodiment) according to the present invention, and showing the structure of the TFT substrate obtained by using the mask patterns.
FIG. 16 is a table showing correspondence relations between the mask patterns and respective regions of members formed on the TFT substrate shown in FIG. 15.

FIG. 15 is a view showing mask patterns used in a method for manufacturing a TFT substrate according to a fourth embodiment of the present invention, and showing the structure of the TFT substrate obtained by using the mask patterns. FIG. 16 is a table showing correspondence relations between the mask patterns and respective regions of members formed on the TFT substrate.

In FIG. 15, a channel PCH of a p-type TFT is formed in a region which is unexposed through an opaque region BL of a normal mask MSK and is unexposed through an opaque region BL of a half-tone mask HMK. A channel NCH of an n-type TFT is formed in a region which is unexposed through the opaque region BL of the normal mask MSK and is half-exposed through a semitransparent region HT of the half-tone mask HMK. A source and drain PSD of the p-type TFT is formed in a region which is exposed through a transparent region of the normal mask MSK and is unexposed through the opaque region BL of the half-tone mask HMK. A source and drain NSD of the n-type TFT is formed in a region which is exposed through the transparent region of the normal mask MSK and is half-exposed through the semitransparent region HT of the half-tone mask HMK. A lower capacitor electrode BD is formed in a region which is unexposed through the opaque region BL of the normal mask MSK and is exposed through the transparent region of the half-tone mask HMK.

Note that, in this embodiment, a lead-out electrode LD is formed in a region which is exposed through the transparent region of the normal mask MSK and is exposed through the transparent region of the half-tone mask HMK. This embodiment is an example for forming a so-called gate-overlapped-drain (GOLD) TFT. In the GOLD TFT, a region GLD, which is covered by a gate NGT and to which n-type impurities are implanted at low concentration, is formed near each channel end of the n-type TFT.

In this embodiment as well, both the channels of the p-type TFT and the n-type TFT are defined by the opaque regions of the normal mask MSK, and are not derived from the boundaries between the opaque region and the transparent region or between the opaque region and the semitransparent region of the half-tone mask, which involves accuracy reduction at a time of ashing. Therefore, there is produced an effect of forming the channels at high accuracy.

FIGS. 17A to 17D and 18A to 18E are views showing the method for manufacturing the TFT substrate shown in FIG. 15.

Figure 17A:
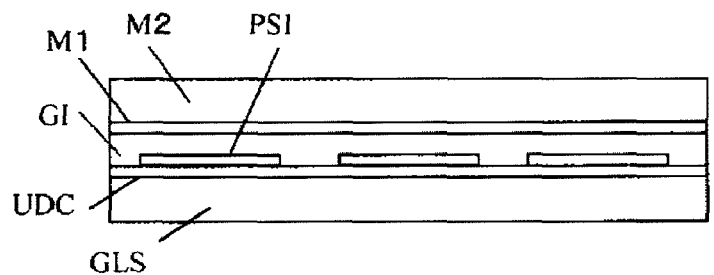
FIGS. 17A to 17D are process sectional views showing, together with FIGS. 18A to 18E, the method for manufacturing the TFT substrate according to the fourth embodiment of the present invention.
Figure 17B:
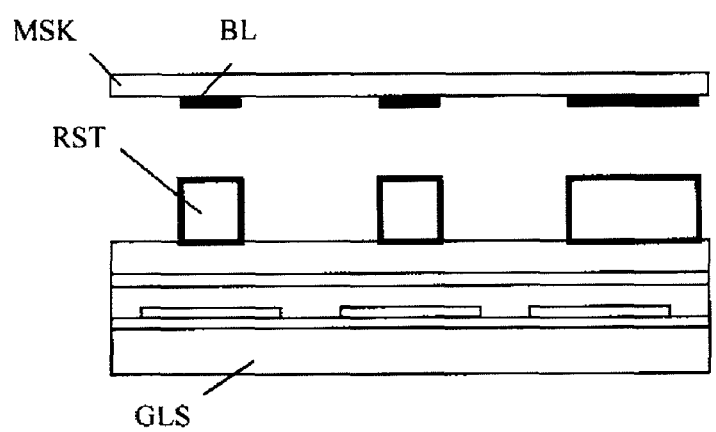
Figure 17C:
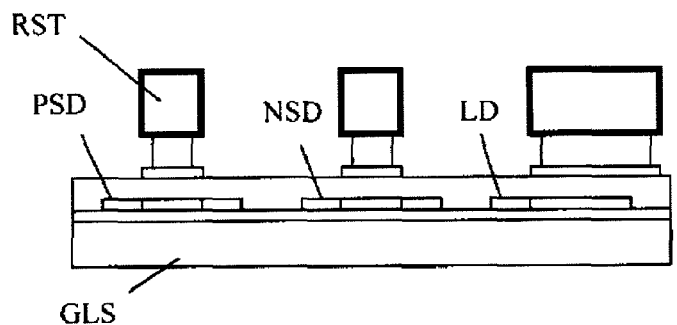
Figure 17D:
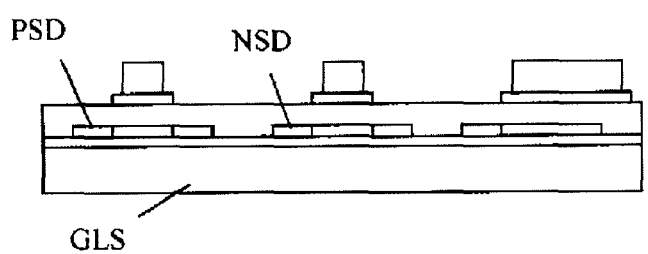
Figure 18A:
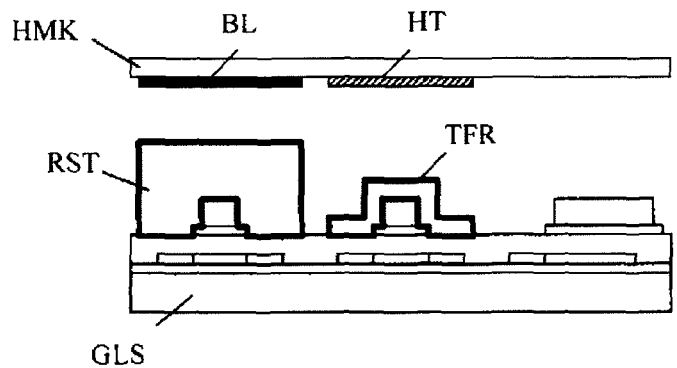
FIGS. 18A to 18E are process sectional views showing, together with FIGS. 17A to 17D, the method for manufacturing the TFT substrate according to the fourth embodiment of the present invention.
Figure 18B:
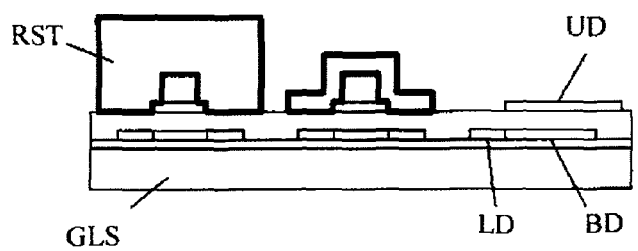
Figure 18C:
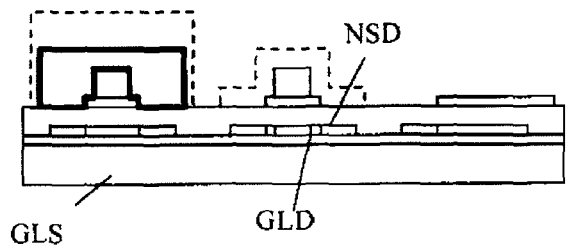
Figure 18D:
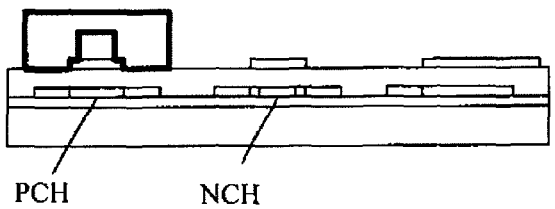
Figure 18E:
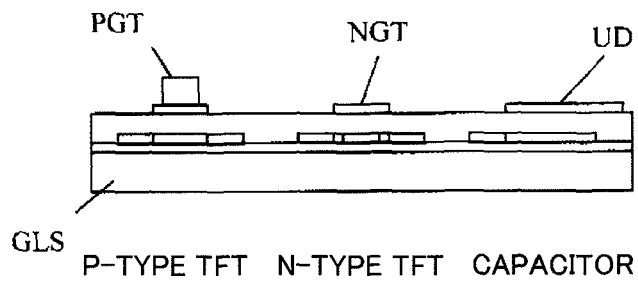

Similarly to the first embodiment of the present invention, first, the structure shown in FIG. 17A is formed. In this case as well, as necessary, n-type impurities are implanted at low concentration into polycrystalline Si films so as to adjust a threshold value of the p-type TFT before a first metal film M1 and a second metal film M2 are formed. Next, a resist pattern RST is formed by using the normal mask MSK to thereby obtain the structure shown in FIG. 17B. After the second metal film M2 and the first metal film M1 are sequentially etched, p-type impurities are implanted to form the source and drain PSD of the p-type TFT, thereby obtaining the shape shown in FIG. 17C. At this time, the p-type impurities are also implanted into regions which become the source and drain NSD of the n-type TFT and the lead-out electrode LD. Further, the second metal film M2 is formed into a shape recessed from the resist pattern, and the first metal film M1 is formed into a substantially the same shape as the shape of the resist pattern. Such a shape described above can be formed as follows: for example, a MoW alloy is used for the second metal film M2 and Ta is used for the first metal film M1, the first metal film M1 and the second metal film M2 are processed by dry etching, and then the second metal film M2 is recessed by using an etchant which etches only the second metal film M2. After the resist is removed, a thick-film resist pattern RST and a thin-film resist pattern TFR are formed by using the half-tone mask HMK, thereby obtaining the structure shown in FIG. 18A. With the use of the resists as masks, the second metal film M2 formed in a capacitor portion is etched to form an upper capacitor electrode UD which is made only of the first metal film M1. Further, first n-type impurity implantation is performed via the second metal film M2 and a gate insulating film GI to implant the n-type impurities into the lower capacitor electrode BD and the lead-out electrode LD, thereby obtaining the structure shown in FIG. 18B. After the thin-film resist is removed by ashing, n-type impurities are implanted at low concentration by using the second metal film M2 and the resist pattern as masks to form a low concentration region GLD. In addition, second n-type impurity implantation is performed with the use of the first metal film M1, the second metal film M2, and the resist as masks, at lower acceleration than that for the first n-type impurity implantation. Then, the source and drain NSD of the n-type TFT is formed, thereby obtaining the structure shown in FIG. 18C. A dose for the first n-type impurity implantation is made larger than a dose for the p-type impurity implantation so that the lower capacitor electrode BD becomes n-type. A dose for the second n-type impurity implantation is made larger than the dose for the p-type impurity implantation so that the source and drain NSD of the n-type TFT becomes n-type. Further, the second metal film M2 is etched to form a gate NGT of the n-type TFT, which is formed only of the first metal film M1. P-type impurities are implanted at low concentration into the channel NCH via the first metal film M1 so as to adjust a threshold value of the n-type TFT, thereby obtaining the structure shown in FIG. 18D. The dose of the p-type impurities in this case is set to smaller than the dose of the n-type impurities used for the formation of the low concentration n-type regions GLD. For example, the dose for the n-type impurity implantation at low concentration is set to $3 \times 10^3/cm^2$, and the dose for the p-type impurity implantation for adjusting the threshold value is set to $3 \times 10^2/cm^2$. Further, the resist is removed, and the p-type TFT, the n-type TFT, and the capacitor are formed on the same substrate as shown in FIG. 18E.

Also in this embodiment, there is attained an advantage in that the threshold values for the n-type TFT and the p-type TFT can be individually adjusted. Besides, wiring and pixel electrodes may be formed to thereby form a TFT substrate for a liquid crystal display in the same way as in the first embodiment of the present invention.

Note that the examples of the TFT substrate for liquid crystal display apparatuses have been described in the above-mentioned embodiments, but the present invention is applicable not only to liquid crystal display apparatuses, but also to other known apparatuses using the TFT substrate, such as a display apparatus using an organic electroluminescence device or a semiconductor device with a built-in sensor using the TFT substrate.

Each of the above-mentioned embodiments may be used alone or in combination, because the effect of each of the above-mentioned embodiments can be exerted independently or synergistically.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method for manufacturing a thin film transistor substrate comprising thin film transistors,
    each of the thin film transistors comprising:
        a semiconductor film portion formed on an insulating substrate;
        a gate insulating film portion laminated on the semiconductor film portion;
        a gate made of a metal film portion formed on the gate insulating film portion; and
        a channel formed in a region covered by the gate, which is formed of the semiconductor film portion, the thin film transistor substrate comprising:
- an n-type thin film transistor having regions of the semiconductor film portion, which are not covered by the gate and to which n-type impurities are doped, the regions becoming a source and a drain;
- a p-type thin film transistor having regions of the semiconductor film portion, which are not covered by the gate and to which p-type impurities are doped, the regions becoming a source and a drain; and
- a capacitor including:
  - a lower capacitor electrode formed in a region of another semiconductor film portion, to which the n-type impurities are doped, the another semiconductor film portion being formed on the same layer as the semiconductor film portion;
  - an upper capacitor electrode made of a metal film portion; and
  - another insulating film portion formed on the same layer as the gate insulating film portion to be interposed between the lower capacitor electrode and the upper capacitor electrode, the method comprising:
- processing the gate of the n-type thin film transistor, the gate of the p-type thin film transistor, and the upper capacitor electrode by using a first mask and a second mask; and
- changing impurity concentrations of semiconductor film portions located in regions which become the channel of the n-type thin film transistor, the source and the drain of the n-type thin film transistor, the channel of the p-type thin film transistor, the source and the drain of the p-type thin film transistor, and the lower capacitor electrode, by using only a pattern of the first mask and a pattern of the second mask,
- the first mask being a half-tone mask having a transparent region, an opaque region, and a semitransparent region,
- the second mask having a transparent region and an opaque region,
- wherein boundaries between the channel of the n-type thin film transistor and the source and the drain of the n-type thin film transistor, and boundaries between the channel of the p-type thin film transistor and the source and the drain of the p-type thin film transistor are defined by boundaries other than a boundary between the opaque region and the semitransparent region of the half-tone mask or a boundary between the opaque region and the transparent region of the half-tone mask.

2. The method according to claim 1, wherein the channel of the n-type thin film transistor is defined by a pattern of the opaque region of the second mask, and the channel of the p-type thin film transistor is defined by a pattern of the semitransparent region of the first mask.

3. A method for manufacturing a thin film transistor substrate comprising thin film transistors,
each of the thin film transistors comprising:
- a semiconductor film portion formed on an insulating substrate;
- a gate insulating film portion laminated on the semiconductor film portion;
- a gate made of a metal film portion formed on the gate insulating film portion; and
- a channel formed in a region covered by the gate, which is formed of the semiconductor film portion, the thin film transistor substrate comprising:
- an n-type thin film transistor having regions of the semiconductor film portion, which are not covered by the gate and to which n-type impurities are doped, the regions becoming a source and a drain;
- a p-type thin film transistor having regions of the semiconductor film portion, which are not covered by the gate and to which p-type impurities are doped, the regions becoming a source and a drain; and
- a capacitor including:
  - a lower capacitor electrode formed in a region of another semiconductor film portion, to which the n-type impurities are doped, the another semiconductor film portion being formed on the same layer as the semiconductor film portion;
  - an upper capacitor electrode made of a metal film portion; and
  - another insulating film portion formed on the same layer as the gate insulating film portion to be interposed between the lower capacitor electrode and the upper capacitor electrode, the method comprising:
- processing the gate of the n-type thin film transistor, the gate of the p-type thin film transistor, and the upper capacitor electrode by using a first mask and a second mask;
- forming the channel of the n-type thin film transistor and the channel of the p-type thin film transistor in regions which are half-exposed with the first mask and unexposed with the second mask;
- forming the source and the drain of the n-type thin film transistor in regions which are half-exposed with the first mask and exposed with the second mask;
- forming the source and the drain of the p-type thin film transistor in regions which are exposed with the first mask and unexposed with the second mask; and
- forming the lower capacitor electrode in a region which is unexposed with the first mask and exposed with the second mask,
- the first mask being a half-tone mask having a transparent region, an opaque region, and a semitransparent region,
- the second mask having a transparent region and an opaque region.

* * * * *